US009236291B2

(12) United States Patent
Usami

(10) Patent No.: US 9,236,291 B2
(45) Date of Patent: Jan. 12, 2016

(54) METHOD OF MANUFACTURING SEMICONDUCTOR DEVICE

(71) Applicant: Renesas Electronics Corporation, Kawasaki-shi (JP)

(72) Inventor: Tatsuya Usami, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/798,284

(22) Filed: Jul. 13, 2015

(65) Prior Publication Data

US 2015/0318201 A1 Nov. 5, 2015

Related U.S. Application Data

(63) Continuation of application No. 14/056,792, filed on Oct. 17, 2013, now Pat. No. 9,123,537.

(30) Foreign Application Priority Data

Oct. 18, 2012 (JP) ................................. 2012-230525

(51) Int. Cl.
*H01L 21/00* (2006.01)
*H01L 21/768* (2006.01)
(Continued)

(52) U.S. Cl.
CPC ...... *H01L 21/76811* (2013.01); *H01L 21/0217* (2013.01); *H01L 21/02164* (2013.01);
(Continued)

(58) Field of Classification Search
CPC ................................ H01L 21/02; H01L 21/44
USPC ......... 438/482, 488, 597, 623, 624, 687, 723, 438/727; 257/E21.029, E21.578
See application file for complete search history.

(56) References Cited

U.S. PATENT DOCUMENTS 6,514,852 B2 * 2/2003 Usami ............... H01L 21/76811
257/750
6,642,138 B2 * 11/2003 Pan et al. .......... H01L 21/76811
257/E21.579
(Continued)

FOREIGN PATENT DOCUMENTS

| JP | 2002-43419 A | 2/2002 |
| JP | 2003-100871 A | 4/2003 |
| WO | WO 2007-043634 A1 | 4/2007 |

OTHER PUBLICATIONS

United State Notice of Allowance dated Apr. 30, 2015 in U.S. Appl. No. 14/056,792.
(Continued)

*Primary Examiner* — Caleb Henry
(74) *Attorney, Agent, or Firm* — McGinn IP Law Group, PLLC

(57) ABSTRACT

A method of manufacturing a semiconductor device, including (a) forming an interlayer insulating film over a semiconductor substrate; (b) forming a third hard mask film over the interlayer insulating film; (c) forming a second hard mask film over the third hard mask film; (d) forming a first hard mask film over the second hard mask film; (e) after the step (d), forming a first opening in the first hard mask film and a second opening in the second hard mask film by etching the first and second hard mask films, respectively; (f) after the step (e), etching the first hard mask film so as to expand the first opening; and (g) after the step (f), etching the third hard mask film and a part of the interlayer insulating film in the second opening by using the second hard mask film as a mask.

7 Claims, 20 Drawing Sheets

(51) Int. Cl.
*H01L 21/02* (2006.01)
*H01L 21/311* (2006.01)
*H01L 21/033* (2006.01)
*H01L 21/3205* (2006.01)

(52) U.S. Cl.
CPC .... *H01L21/02167* (2013.01); *H01L 21/02532* (2013.01); *H01L 21/02592* (2013.01); *H01L 21/02595* (2013.01); *H01L 21/0332* (2013.01); *H01L 21/0337* (2013.01); *H01L 21/31144* (2013.01); *H01L 21/32051* (2013.01); *H01L 21/76877* (2013.01)

(56) References Cited

U.S. PATENT DOCUMENTS

| | | | | |
|---|---|---|---|---|
| 6,797,630 B1* | 9/2004 | Wu | H01L 21/0337 | 257/E21.038 |
| 6,818,547 B2* | 11/2004 | Chen | H01L 21/76808 | 257/E21.579 |
| 6,911,397 B2* | 6/2005 | Jun | H01L 21/76807 | 257/E21.252 |
| 6,930,036 B2 | 8/2005 | Usami | | |
| 7,057,286 B2 | 6/2006 | Usami | | |
| 7,196,003 B2* | 3/2007 | Iba | H01L 21/31116 | 257/E21.252 |
| 7,214,609 B2* | 5/2007 | Jiang | H01L 21/76808 | 257/E21.577 |
| 7,214,612 B2* | 5/2007 | Huang | H01L 21/76813 | 257/E21.579 |
| 7,285,490 B2* | 10/2007 | Barth | H01L 23/5223 | 257/E21.579 |
| 7,309,653 B2* | 12/2007 | Anderson | H01L 21/31144 | 257/758 |
| 7,429,536 B2* | 9/2008 | Abatchev | H01L 21/0337 | 257/E21.038 |
| 7,435,676 B2* | 10/2008 | Dalton | H01L 21/76801 | 257/E21.576 |
| 7,452,795 B2* | 11/2008 | Iba | H01L 21/76808 | 257/E21.024 |
| 7,491,640 B2* | 2/2009 | Nagase | H01L 21/76811 | 257/E21.579 |
| 7,727,888 B2* | 6/2010 | Yang | H01L 21/76805 | 257/773 |
| 7,749,897 B2* | 7/2010 | Sugimoto | H01L 21/76808 | 257/E21.252 |
| 7,755,196 B2* | 7/2010 | Barth | H01L 23/5223 | 257/499 |
| 7,811,930 B2* | 10/2010 | Wang | H01L 21/76808 | 257/E21.495 |
| 7,884,019 B2* | 2/2011 | Jiang | H01L 21/76811 | 257/E21.577 |
| 7,977,244 B2* | 7/2011 | Lai | H01L 21/02063 | 134/1.2 |
| 7,981,308 B2* | 7/2011 | Yama | B81C 1/00595 | 216/41 |
| 8,008,200 B2* | 8/2011 | Jiang | H01L 21/76811 | 257/E21.577 |
| 8,232,143 B2* | 7/2012 | Yama | B81C 1/00595 | 438/118 |
| 8,252,699 B2* | 8/2012 | Konecni | H01L 21/02115 | 257/E21.035 |
| 8,501,395 B2* | 8/2013 | Dai | G03F 7/2006 | 430/323 |
| 8,735,283 B2* | 5/2014 | Arnold | H01L 21/0273 | 438/618 |
| 8,987,089 B1* | 3/2015 | Pachamuthu | H01L 27/11551 | 438/268 |
| 9,076,645 B1* | 7/2015 | Ray | H01L 21/02123 | |
| 2002/0009873 A1* | 1/2002 | Usami | H01L 21/76811 | 438/620 |
| 2003/0008490 A1* | 1/2003 | Xing | H01L 21/31144 | 438/622 |
| 2003/0119307 A1* | 6/2003 | Bekiaris | H01L 21/0332 | 438/638 |
| 2003/0219973 A1* | 11/2003 | Townsend, III | H01L 21/0271 | 438/631 |
| 2004/0166666 A1 | 8/2004 | Usami | | |
| 2004/0227242 A1* | 11/2004 | Noguchi | H01L 21/314 | 257/751 |
| 2005/0017364 A1* | 1/2005 | Iba | H01L 21/3105 | 257/758 |
| 2006/0270214 A1* | 11/2006 | Iba | H01L 21/76808 | 438/637 |
| 2007/0281219 A1* | 12/2007 | Sandhu | B82Y 10/00 | 430/5 |
| 2008/0054464 A1* | 3/2008 | Ikeda | H01L 21/76831 | 257/751 |
| 2008/0057692 A1* | 3/2008 | Wells | H01L 21/0337 | 438/597 |
| 2008/0083989 A1* | 4/2008 | Aoi | H01L 21/28562 | 257/751 |
| 2008/0286961 A1* | 11/2008 | Arai | H01L 21/31144 | 438/623 |
| 2008/0318409 A1* | 12/2008 | Sakata | H01L 21/76808 | 438/623 |
| 2010/0219533 A1* | 9/2010 | Ootake | H01L 21/76808 | 257/773 |
| 2011/0095257 A1* | 4/2011 | Xu | H01L 21/02115 | 257/3 |
| 2012/0244642 A1* | 9/2012 | Nagai | H01L 23/53238 | 438/3 |
| 2012/0282751 A1* | 11/2012 | Oh | H01L 21/0337 | 438/382 |
| 2013/0015581 A1* | 1/2013 | Wann | H01L 23/53276 | 257/751 |
| 2013/0147007 A1* | 6/2013 | Booth, Jr. | H01L 27/10829 | 257/508 |
| 2013/0207265 A1* | 8/2013 | Liu | H01L 21/76885 | 257/741 |
| 2013/0302912 A1* | 11/2013 | Zhong | H01L 43/08 | 438/3 |
| 2013/0313717 A1* | 11/2013 | Holmes | H01L 21/76811 | 257/774 |
| 2014/0127834 A1* | 5/2014 | Wang | H01L 21/6715 | 438/5 |
| 2014/0141602 A1* | 5/2014 | Sorschag | H01L 29/66 | 438/504 |
| 2014/0148012 A1* | 5/2014 | Guillorn | B81C 1/00031 | 438/700 |
| 2014/0187044 A1* | 7/2014 | Tsai | H01L 21/3065 | 438/694 |
| 2014/0264516 A1* | 9/2014 | Seo | H01L 43/12 | 257/295 |
| 2015/0004797 A1* | 1/2015 | Nagarah | H01L 1/31144 | 438/725 |
| 2015/0037980 A1* | 2/2015 | Rha | H01L 21/306 | 438/700 |
| 2015/0056805 A1* | 2/2015 | Park | H01L 21/76802 | 438/672 |
| 2015/0064914 A1* | 3/2015 | Kong | H01J 37/32082 | 438/696 |
| 2015/0235962 A1* | 8/2015 | Noguchi et al. | H01L 23/53295 | 257/760 |

OTHER PUBLICATIONS

United States Non-Final Office Action dated October 22, 2014 in U.S. Appl. No. 14/056,792.

* cited by examiner

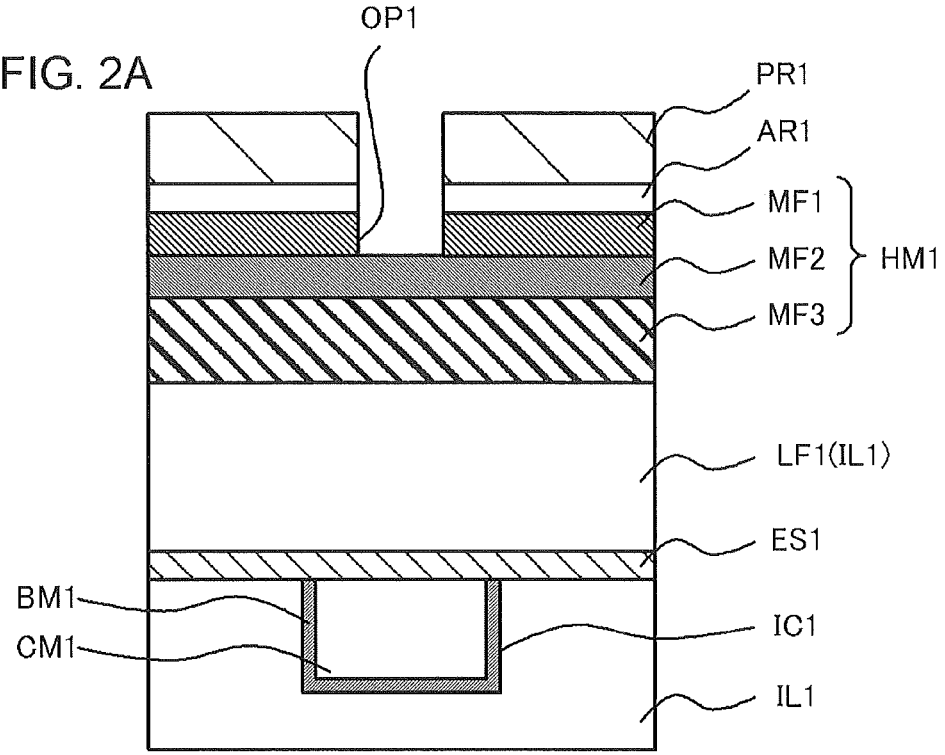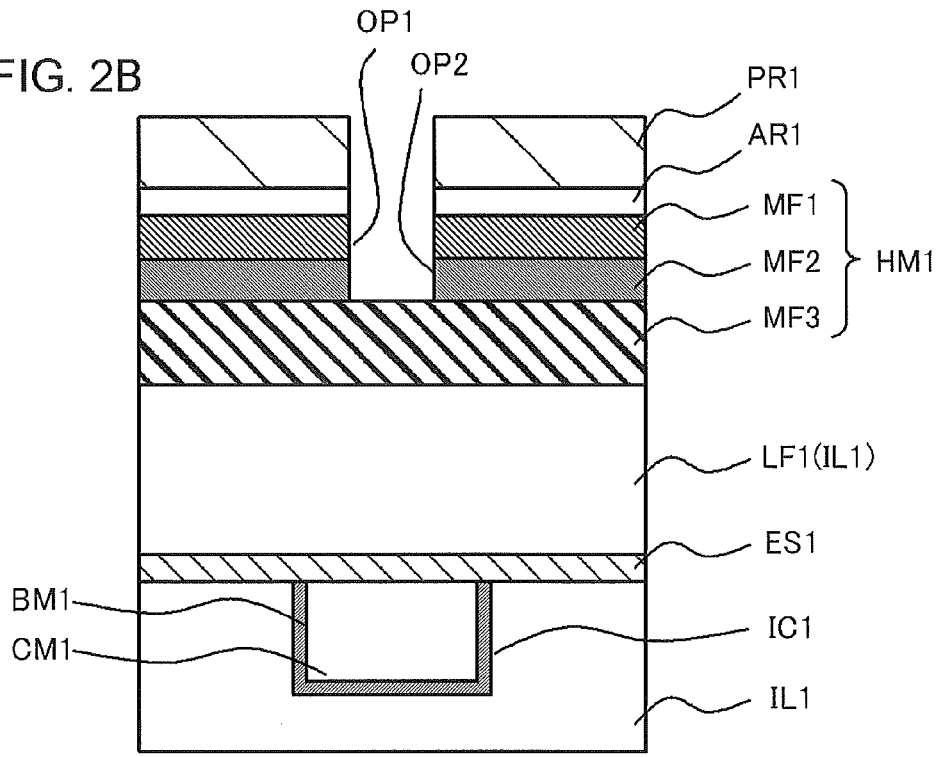

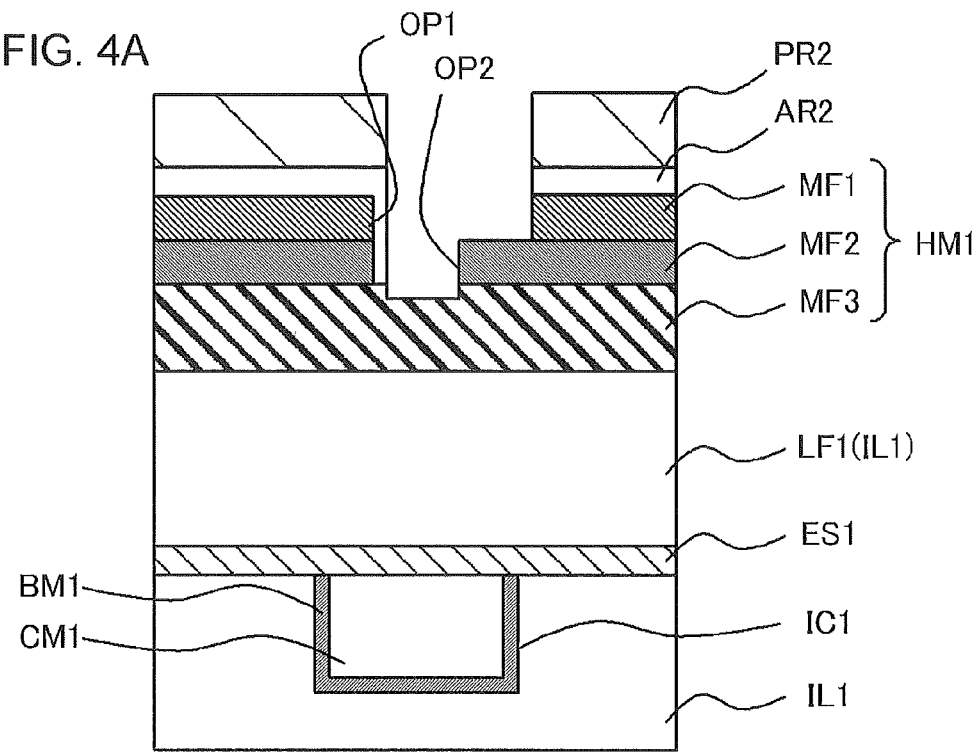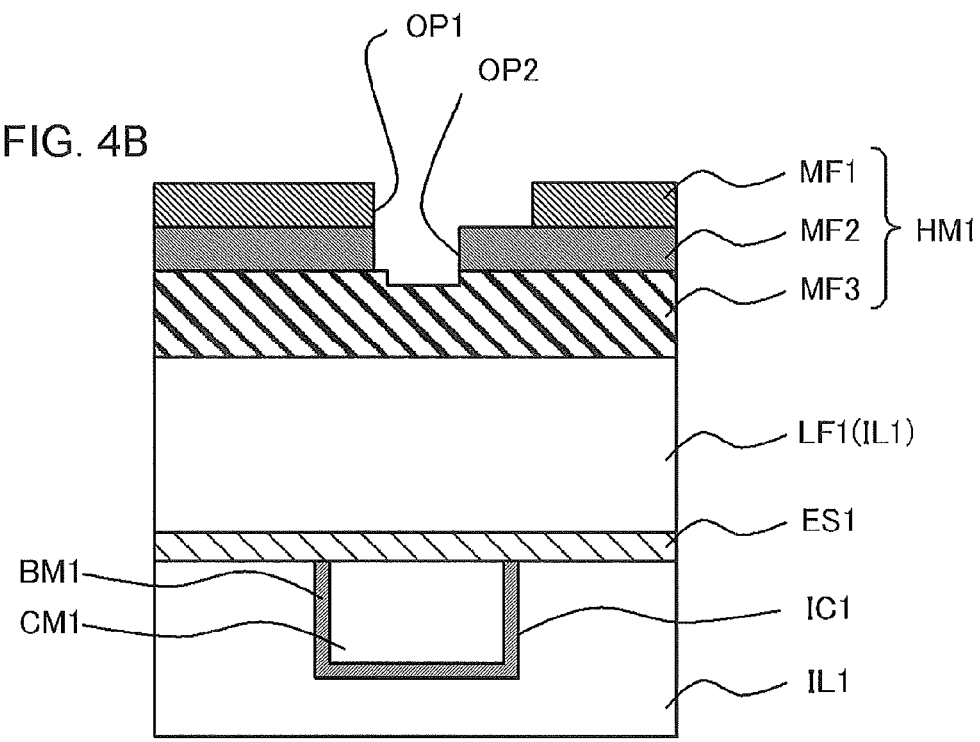

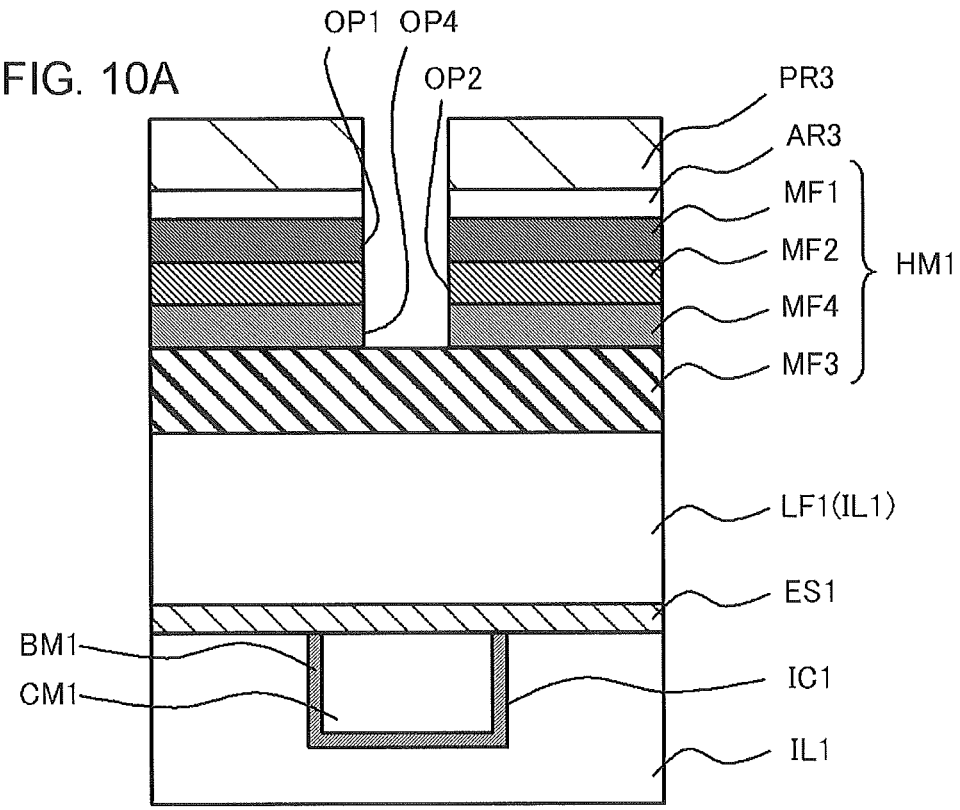
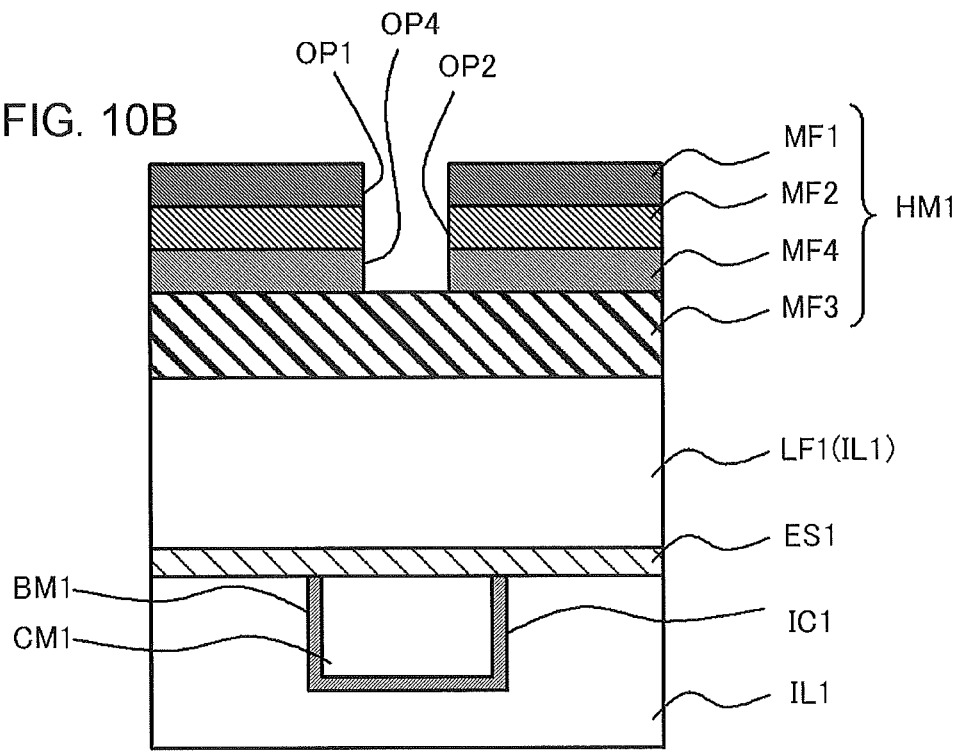

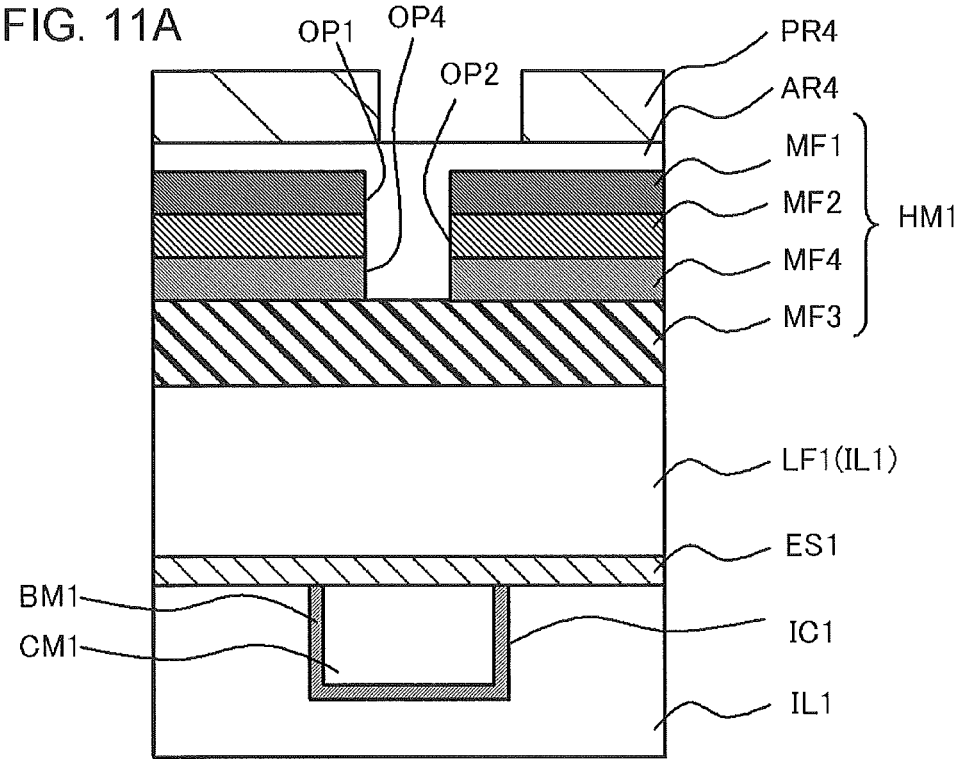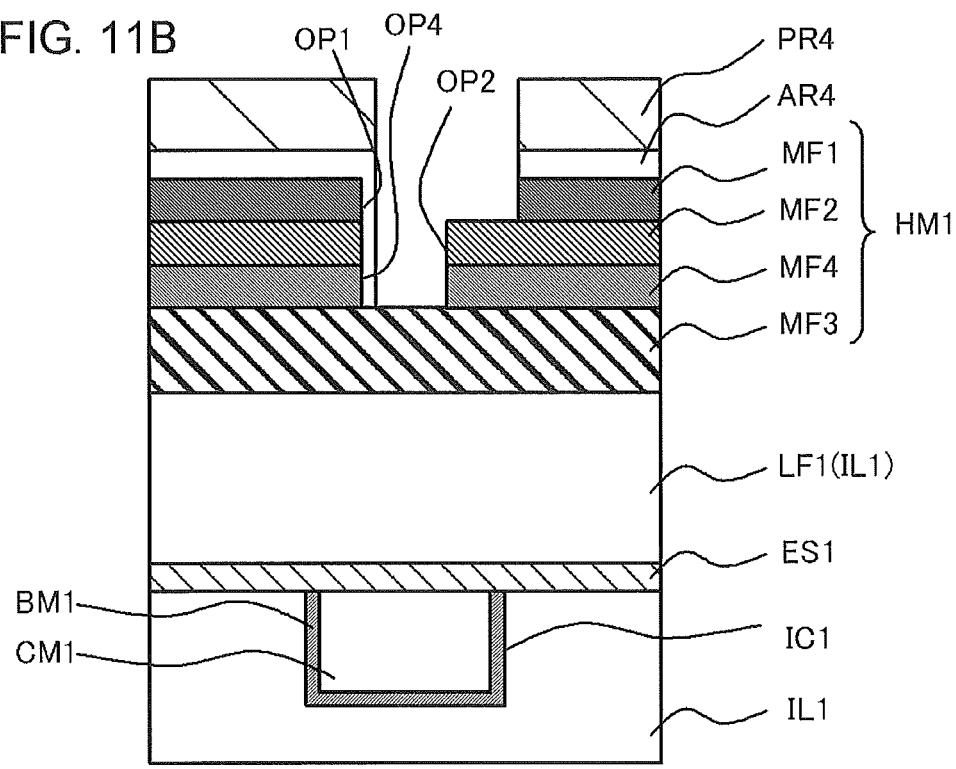

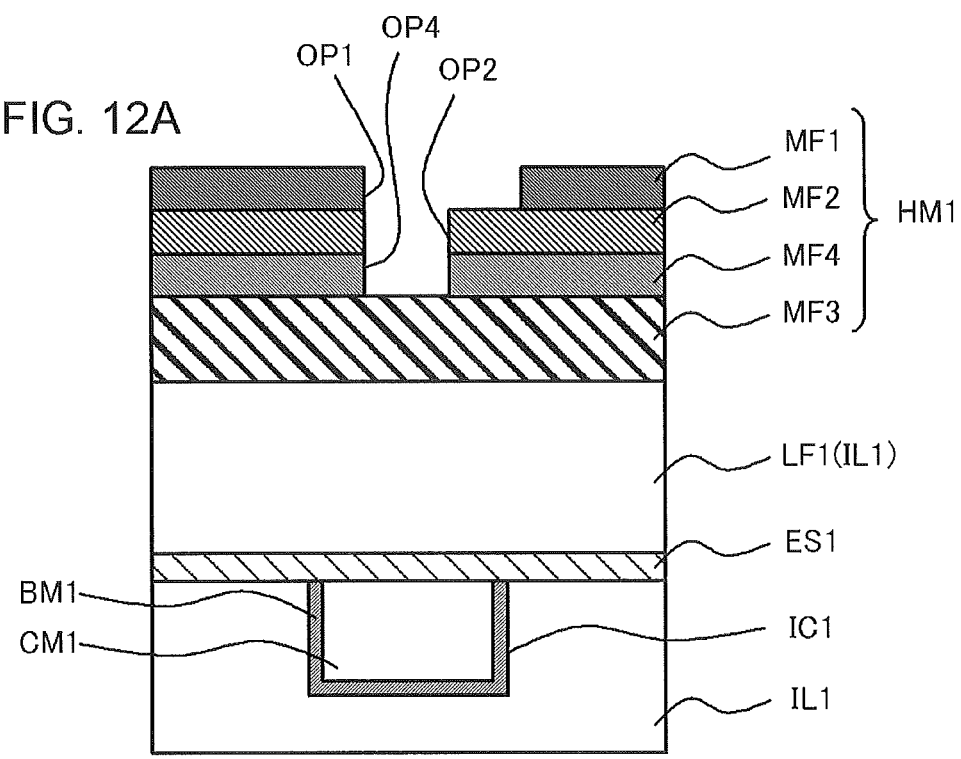
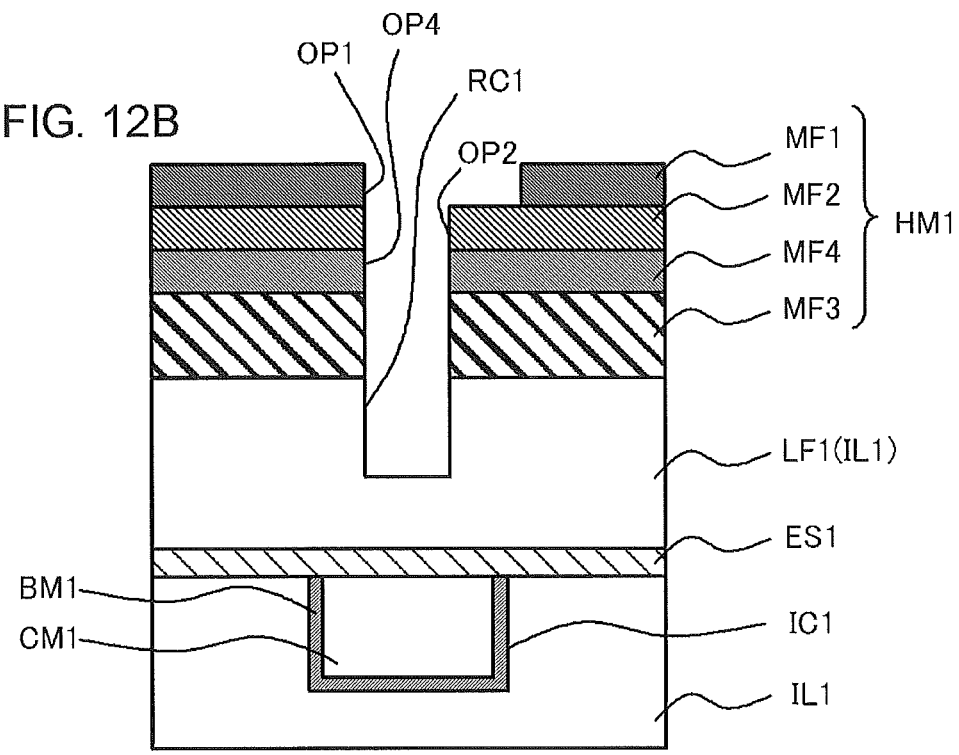

METHOD OF MANUFACTURING SEMICONDUCTOR DEVICE

The present application is a Continuation Application of U.S. patent application Ser. No. 14/056,792, filed on Oct. 17, 2013, which is based on Japanese patent application No. 2012-230525 filed on Oct. 18, 2012, the entire contents of which are hereby incorporated by reference.

BACKGROUND

1. Technical Field

The invention relates to a method of manufacturing a semiconductor device, and relates to, for example, a technique applicable to a method of manufacturing a semiconductor device including an etching process using a hard mask.

2. Related Art

In methods of manufacturing a semiconductor device, an interconnect layer may be formed by, for example, etching using a hard mask. In this manner, techniques including a process of forming an interconnect layer by etching using a hard mask include, for example, techniques disclosed in Japanese Unexamined Patent Publication No. 2003-100871, Pamphlet of International Publication No. WO2007/043634, and Japanese Unexamined Patent Publication No. 2002-43419.

Japanese Unexamined Patent Publication No. 2003-100871 relates to an interconnect formation method using a double hard mask in which a first hard mask layer and a second hard mask layer are laminated in order. This technique discloses that the second hard mask includes a material selected from a group consisting of aluminized titanium, aluminum titanium nitride, titanium nitride, aluminum nitride, aluminized tantalum and aluminum tantalum nitride.

Pamphlet of International Publication No. WO2007/043634 relates to a method of manufacturing a multilayer interconnect in which a first insulating film for a mask, a metal or metal compound, and a second insulating film for a mask are formed in order on an insulating film to be etched. Japanese Unexamined Patent Publication No. 2002-43419 relates to a method of manufacturing a semiconductor device using a multilayer hard mask layer constituted by a first insulating hard mask layer, a second insulating hard mask layer, and a third insulating hard mask layer.

In the formation of an interconnect layer having a dual damascene structure, an insulating interlayer constituted by a low dielectric constant film may be etched using a hard mask. However, the exposure of the low dielectric constant film when a photoresist at the time of patterning the hard mask is removed by an ashing process may cause a concern of the low dielectric constant film being damaged. In this case, a problem such as an increase in the dielectric constant of the low dielectric constant film occurs.

In order to suppress this, a method of using a hard mask constituted by a multilayer mask film has been examined. However, in such a hard mask, it has been difficult to sufficiently secure etching selectivity between mask films adjacent to each other. In this case, when a trench pattern or a via pattern is formed, there is a concern that defective patterning may occur. In this case, a reduction in the reliability of an interconnect being formed is caused.

For this reason, a method of manufacturing a semiconductor device which is capable of realizing high interconnect reliability while suppressing damage due to an ashing process has been required.

Other problems and novel features will be made clearer from the description and the accompanying drawings of the present specification.

SUMMARY

In one embodiment, a hard mask film having at least three layers is formed over a low dielectric constant film. The hard mask film having at least three layers includes a third mask film constituting the hard mask film which is located as a lowermost layer, a second mask film constituting the hard mask film which is located over the third mask film, and a first mask film constituting the hard mask film which is located at an uppermost layer. After a trench pattern and a via pattern are formed in the first mask film and the second mask film, respectively, by etching using a photoresist as a mask, the third mask film is etched using the second mask film as a mask.

In addition, the hard mask film having at least three layers is configured such that the hard mask film formed of an insulating material and the hard mask film formed of a metal material, amorphous silicon or polycrystalline silicon are alternately laminated.

According to the embodiment, it is possible to provide a method of manufacturing a semiconductor device which is capable of realizing high interconnect reliability while suppressing damage due to an ashing process.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are cross-sectional views illustrating the method of manufacturing a semiconductor device according to the first embodiment.

FIGS. 4A and 4B are cross-sectional views illustrating the method of manufacturing a semiconductor device according to the first embodiment.

FIGS. 10A and 10B are cross-sectional views illustrating a method of manufacturing a semiconductor device according to the second embodiment.

FIGS. 11A and 11B are cross-sectional views illustrating a method of manufacturing a semiconductor device according to the second embodiment.

FIGS. 12A and 12B are cross-sectional views illustrating a method of manufacturing a semiconductor device according to the second embodiment.

DETAILED DESCRIPTION

Figure 1A:
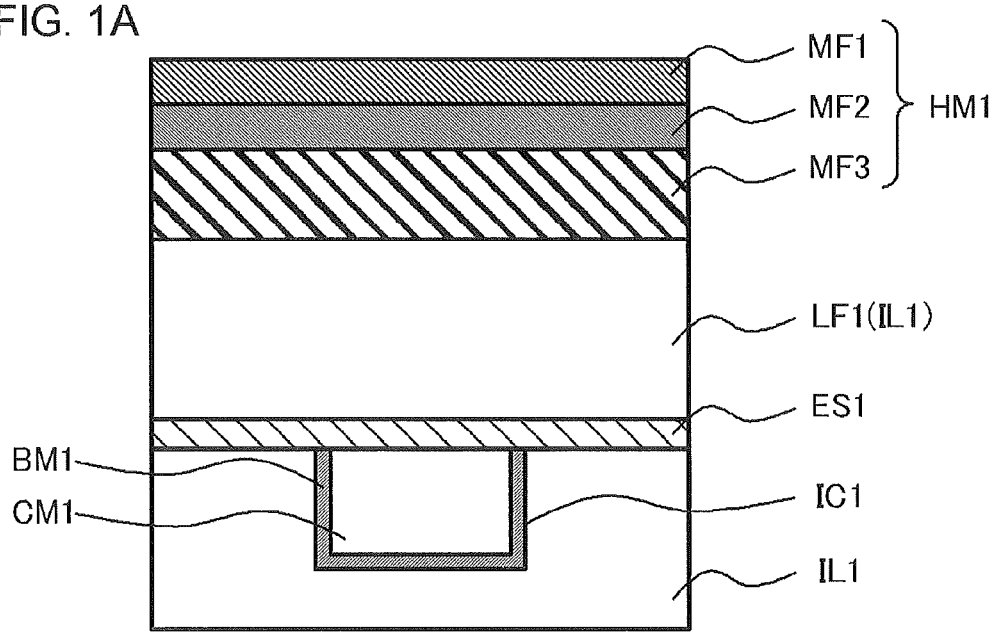
FIGS. 1A and 1B are cross-sectional views illustrating a method of manufacturing a semiconductor device according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all the drawings, like elements are referenced by like reference numerals and descriptions thereof will not be repeated.

First Embodiment

FIGS. 1A and 1B to FIGS. 7A and 7B are cross-sectional views illustrating a method of manufacturing a semiconductor device SM1 according to a first embodiment. The method of manufacturing the semiconductor device SM1 according to the present embodiment is performed as follows.

First, a hard mask film HM1 having at least three layers is formed on a low dielectric constant film having a lower dielectric constant than that of a silicon oxide. Here, the hard mask film HM1 formed of an insulating material and the hard mask film HM1 formed of a metal material, amorphous silicon or polycrystalline silicon are alternately laminated.

Next, etching of the hard mask film HM1 using a photoresist as a mask and an ashing process of removing the photoresist are repeated. Thereby, a trench pattern is formed in a first mask film MF1 constituting the hard mask film HM1 which is located at an uppermost layer. In addition, a via pattern located on the inside of the trench pattern, when seen in a plan view, is formed in a second mask film MF2 constituting the hard mask film HM1 which is located below the first mask film MF1.

Next, a third mask film MF3 constituting the hard mask film HM1 which is located as a lowermost layer and a low dielectric constant film LF1 are etched using the second mask film MF2 as a mask, and a recess RC1 which passes through the third mask film MF3 and leads to the low dielectric constant film LF1 is formed.

Next, a portion located below the trench pattern in the third mask film MF3 is etched, and the low dielectric constant film LF1 is etched. Thereby, a via hole VH1 overlapping the recess RC1 and a trench WT1 which is located on the via hole VH1 and overlaps the trench pattern are formed in the low dielectric constant film LF1.

Next, a conductive film CM1 is buried within the via hole VH1 and the trench WT1.

In this manner, the semiconductor device SM1 according to the present embodiment is obtained.

Meanwhile, in the present specification, a pattern formed in the hard mask film HM1 corresponding to a trench for burying an interconnect in the low dielectric constant film LF1 is referred to as a trench pattern. In addition, a pattern formed in the hard mask film HM1 corresponding to a via hole for burying a via plug in the low dielectric constant film LF1 is referred to as a via pattern.

According to the present embodiment, the hard mask film HM1 having at least three layers are formed on the low dielectric constant film LF1. The hard mask film HM1 having at least three layers includes the third mask film MF3 constituting the hard mask film HM1 which ia located as a lowermost layer, the second mask film MF2 constituting the hard mask film HM1 which is located on the third mask film MF3, and the first mask film MF1 constituting the hard mask film HM1 which is located at an uppermost layer. After the trench pattern and the via pattern are formed in the first mask film MF1 and the second mask film MF2, respectively, by etching using a photoresist as a mask, the third mask film MF3 is etched using the second mask film MF2 as a mask. Thereby, when a photoresist is removed by an ashing process, the low dielectric constant film LF1 can be protected by the third mask film MF3. Therefore, it is possible to suppress damage due to the ashing process in the low dielectric constant film LF1.

In addition, the hard mask film HM1 having at least three layers is configured such that the hard mask film HM1 formed of an insulating material and the hard mask film HM1 formed of a metal material, amorphous silicon or polycrystalline silicon are alternately laminated. Thereby, it is possible to sufficiently secure etching selectivity between the hard mask films HM1 adjacent to each other. Therefore, it is possible to suppress the occurrence of defective patterning when the trench pattern and the via pattern are formed, and to realize high interconnect reliability.

Hereinafter, the configuration of the semiconductor device SM1 according to the present embodiment and the method of manufacturing thereof will be described in detail.

First, the configuration of the semiconductor device SM1 according to the present embodiment will be described.

Figure 8:
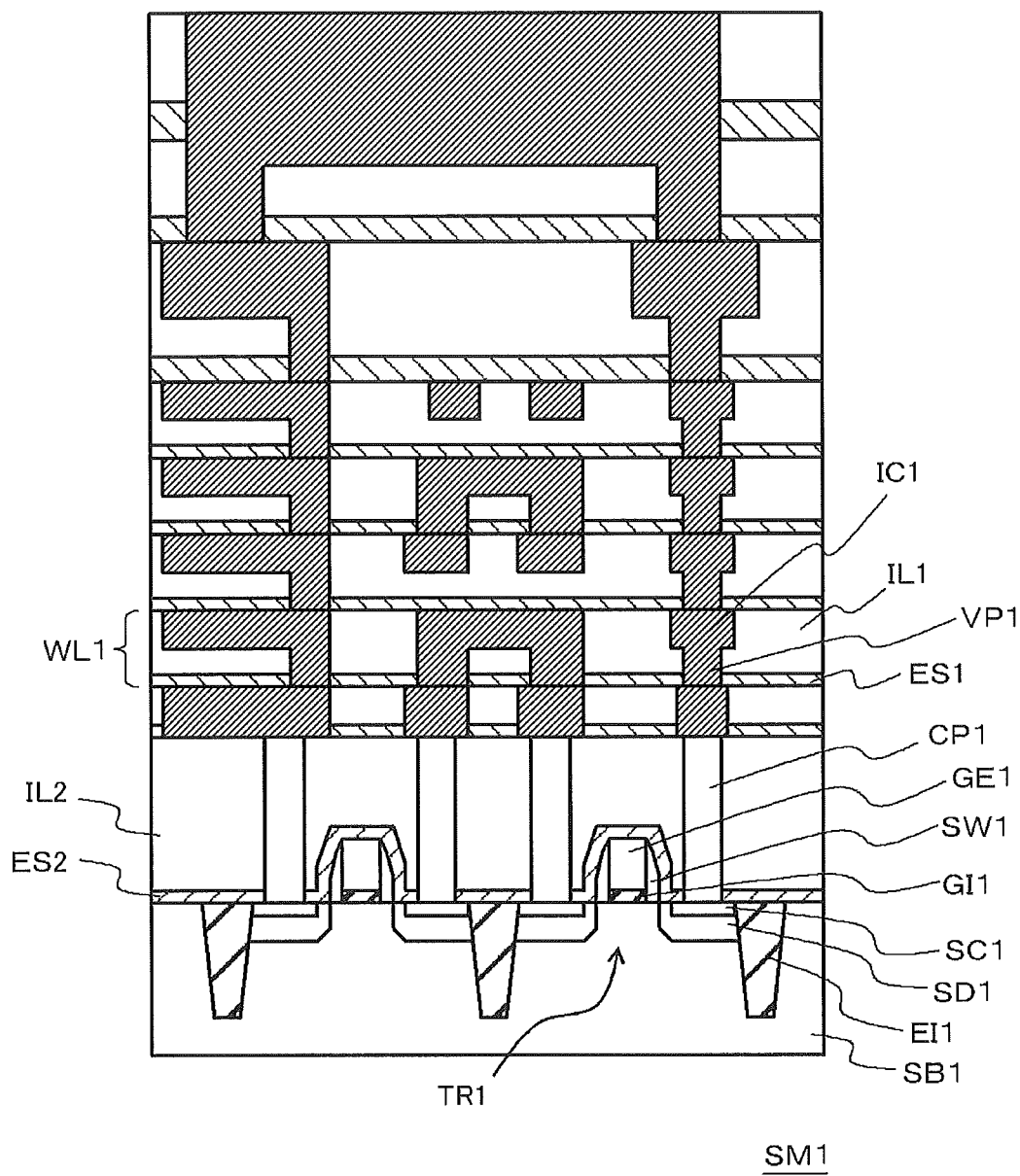
FIG. 8 is a cross-sectional view illustrating a semiconductor device according to the first embodiment.

FIG. 8 is a cross-sectional view illustrating the semiconductor device SM1 according to the present embodiment. As shown in FIG. 8, the semiconductor device SM1 has, for example, a semiconductor substrate SB1, a transistor TR1 provided in the semiconductor substrate SB1, and a multi-layer interconnect structure which is constituted by a plurality of interconnect layers WL1.

The semiconductor substrate SB1 is, for example, a silicon substrate. The semiconductor device SM1 is provided with an element isolation film EI1 for electrically isolating the transistor TR1 from other elements.

The transistor TR1 includes a gate insulating film GI1, a gate electrode GE1, a sidewall SW1, and a source and drain region SD1. The gate insulating film GI1 is provided on the semiconductor substrate SB1. The gate electrode GE1 is provided on the gate insulating film GI1. The sidewall SW1 is formed on the lateral sides of the gate insulating film GI1 and the gate electrode GE1. The source and drain region SD1 is formed in the semiconductor substrate SB1. The source and drain region SD1 is formed by, for example, ion implantation using the gate electrode GE1, the sidewall SW1 and the element isolation film EI1 as a mask. A silicide layer SC1, for example, is formed on the source and drain region SD1.

An etching stopper film ES2 is formed on the semiconductor substrate SB1 so as to cover the transistor TR1. An insulating interlayer IL2 is formed on the etching stopper film ES2. A contact plug CP1 which passes through the insulating interlayer IL2 and the etching stopper film ES2 and is connected to the source and drain region SD1 is formed in the insulating interlayer IL2. In the present embodiment, the contact plug CP1 is formed, for example, so as to be connected to the silicide layer SC1 provided on the source and drain region SD1.

A multilayer interconnect layer having the plurality of interconnect layers WL1 being laminated therein is formed on the insulating interlayer IL2. The multilayer interconnect layer is constituted by an etching stopper film ES1, an insulating interlayer IL1 provided on the etching stopper film ES1, and an interconnect IC1 and a via plug VP1 which are formed in the insulating interlayer IL1. The insulating interlayer IL1 is constituted by the low dielectric constant film LF1, for example, shown in FIG. 1. The interconnect IC1 and the via plug VP1 has, for example, a dual damascene structure in which they are formed integrally with each other.

Next, the method of manufacturing the semiconductor device SM1 according to the present embodiment will be described in detail.

The semiconductor device SM1 according to the present embodiment is obtained by forming a multilayer interconnect structure, constituted by the plurality of interconnect layers WL1, on the transistor TR1 after the transistor TR1 is formed on the semiconductor substrate SB1.

The formation of each interconnect layer WL1 is performed as follows.

First, as shown in FIG. 1A, the etching stopper film ES1 and the low dielectric constant film LF1 are formed in order on the insulating interlayer IL1 in which the interconnect IC1 is buried. The low dielectric constant film LF1 constitutes the insulating interlayer IL1 of the interconnect layer WL1.

Here, the insulating interlayer IL1 in which the interconnect IC1 is buried constitutes another interconnect layer WL1 located below the above-mentioned interconnect layer WL1 formed in the process. Meanwhile, when the interconnect layer WL1 located as a lowermost layer in the multilayer interconnect layer is formed, the etching stopper film ES1 and the insulating interlayer IL1 are formed on the insulating interlayer IL2 in the process.

The etching stopper film ES1 also functions as a barrier film that prevents a conductive material constituting the interconnect IC1 provided at a lower layer from being diffused into the low dielectric constant film LF1. The etching stopper film ES1 is formed of, for example, SiCN.

The low dielectric constant film LF1 has a lower dielectric constant than that of a silicon oxide. The relative dielectric constant of the low dielectric constant film LF1 is preferably, for example, equal to or less than 3, and more preferably equal to or less than 2.5. Thereby, it is possible to suppress an increase in capacitance between interconnects, and to sufficiently achieve a speedup of the semiconductor device and a reduction in power consumption. As the low dielectric constant film LF1, for example, a porous SiCOH film is used. The thickness of the low dielectric constant film LF1 is, for example, equal to or more than 100 nm and equal to or less than 140 nm.

Next, the hard mask film HM1 having at least three layers is formed on the low dielectric constant film LF1.

In the present embodiment, the hard mask film HM1 having three layers is formed on the low dielectric constant film LF1. The hard mask film HM1 having three layers is constituted by the first mask film MF1 constituting the hard mask film HM1 which is located at an uppermost layer, the second mask film MF2 constituting the hard mask film HM1 which is located below the first mask film MF1, and the third mask film MF3 constituting the hard mask film HM1 which is located as a lowermost layer. That is, the third mask film MF3, the second mask film MF2, and the first mask film MF1 are laminated in order on the low dielectric constant film LF1, and thus the hard mask film HM1 having three layers is formed.

The hard mask film HM1 having at least three layers is configured such that the hard mask film HM1 formed of an insulating material and the hard mask film HM1 formed of a metal material, amorphous silicon or polycrystalline silicon are alternately laminated.

It is possible to realize high etching selectivity between the hard mask film HM1 formed of an insulating material and the hard mask film HM1 formed of a metal material, amorphous silicon or polycrystalline silicon. That is, when one film is etched, the other film is not likely to be etched. For this reason, in a plurality of hard mask films HM1 laminated to each other, it is possible to sufficiently secure etching selectivity between the hard mask films HM1 adjacent to each other. Therefore, according to the present embodiment, it is possible to suppress the occurrence of defective patterning when the trench pattern and the via pattern are formed.

The insulating material constituting the hard mask film HM1 is, for example, $SiO_2$, SiN, SiC or SiCN. In addition, the metal material constituting the hard mask film is, for example, TiN, TaN, W, WSi, WN or TiW. Such a material is selected, and thus it is possible to realize high etching selectivity between the hard mask film HM1 made of an insulating material and the hard mask film HM1 made of a metal material.

In the present embodiment, for example, the first mask film MF1 and the third mask film MF3 are formed of an insulating material, and the second mask film MF2 is formed of a metal material, amorphous silicon or polycrystalline silicon. In this case, the third mask film MF3 made of an insulating material is formed on the low dielectric constant film LF1. For this reason, it is possible to improve adhesion between the hard mask film HM1 and the low dielectric constant film LF1. Therefore, it is possible to suppress the occurrence of a problem such as the peeling off of the hard mask film HM1 from the low dielectric constant film LF1.

In the present embodiment, the third mask film MF3 is preferably formed of $SiO_2$. The third mask film MF3 functions as a protective film that protects the low dielectric constant film LF1 in an ashing process described later. The third mask film MF3 is formed of $SiO_2$, thereby allowing the low dielectric constant film LF1 to be more reliably protected when an ashing process using oxygen plasma is performed.

Therefore, it is possible to reliably suppress an increase in the dielectric constant of the low dielectric constant film LF1 due to damage caused by the ashing process.

In addition, the third mask film MF3 is formed of, for example, a material which is not more likely to be etched than the first mask film MF1 in etching for forming a trench pattern in the first mask film MF1. Such a configuration can be realized, for example, by forming the third mask film MF3 out of $SiO_2$ and forming the first mask film MF1 out of SiN.

Thereby, in a process, described later, of etching the first mask film MF1 to form a trench pattern, it is possible to reliably suppress the removal of the third mask film MF3 and the exposure of the low dielectric constant film LF1.

Meanwhile, the first mask film MF1 and the third mask film MF3 may be formed of a metal material, amorphous silicon or polycrystalline silicon, and the second mask film MF2 may be formed of an insulating material.

In this case, the first mask film MF1 is preferably formed of, for example, W, WSi, WN or TiW. A fluoride made of these metal materials has higher vapor pressure than a fluoride made of metal materials such as TiN and TaN. For this reason, the first mask film MF1 located at an uppermost layer is formed of W, WSi, WN or TiW, thereby allowing the generation of a metal fluoride having a low vapor pressure to be suppressed when etching using a fluorocarbon-based etching gas is performed. Therefore, it is possible to suppress the remaining of a residue made of a metal fluoride within the trench pattern.

The thickness of the third mask film MF3 is, for example, equal to or more than 10 nm and equal to or less than 30 nm. The thickness of the second mask film MF2 is, for example, equal to or more than 5 nm and equal to or less than 15 nm. The thickness of the first mask film MF1 is, for example, equal to or more than 5 nm and equal to or less than 15 nm.

Such a film thickness is selected, thereby allowing a function as a hard mask to be sufficiently realized. In addition, it is possible to suppress the occurrence of a problem such as the difficulty of performing removal due to an excessive increase in the thickness of the hard mask film HM1.

Next, the etching of the hard mask film HM1 using a photoresist as a mask and the ashing process of removing the photoresist are repeated. Thereby, a trench pattern is formed in the first mask film MF1, and a via pattern located on the inside of the trench pattern when seen in a plan view is formed in the second mask film MF2. Hereinafter, the process of forming the trench pattern and the via pattern will be described in detail.

Figure 1B:
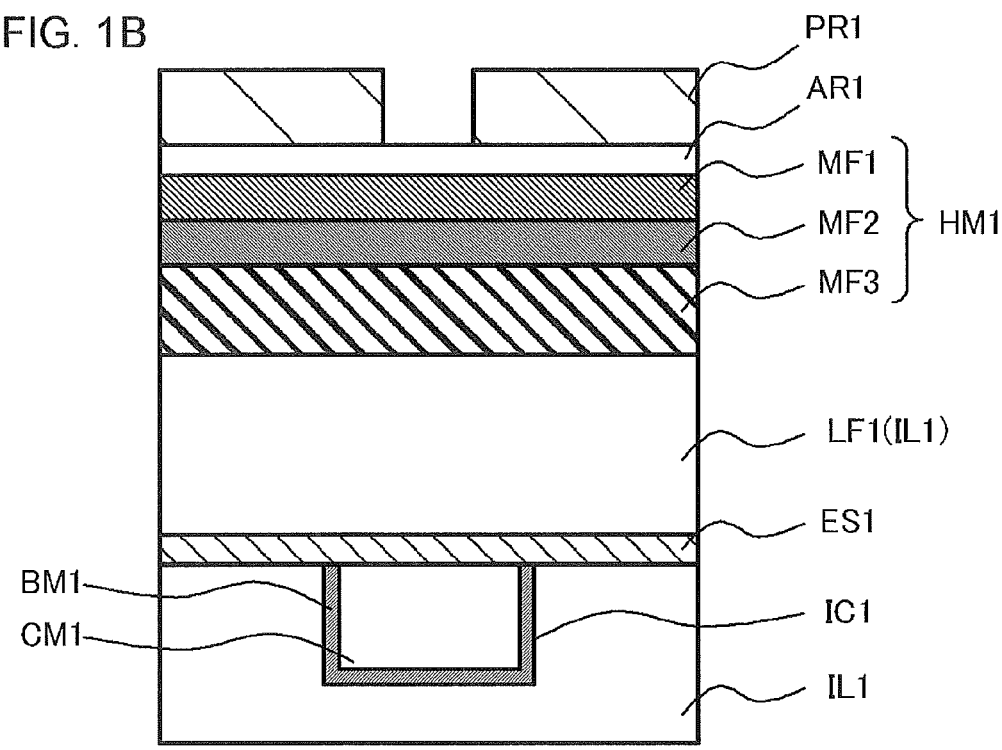

First, as shown in FIG. 1B, an antireflection film AR1 and a photoresist PR1 are formed in order on the hard mask film HM1 having three layers. Next, the photoresist PR1 is patterned by performing the exposure and development thereof.

Next, as shown in FIG. 2A, the antireflection film AR1 and the first mask film MF1 are etched using the photoresist PR1 as a mask. Thereby, an opening OP1 is formed in the first mask film MF1. The etching thereof is performed by, for example, dry etching.

In the present embodiment, the hard mask film HM1 formed of an insulating material and the hard mask film HM1 formed of a metal material, amorphous silicon or polycrystalline silicon are alternately laminated. For this reason, it is possible to realize sufficiently high etching selectivity between the first mask film MF1 and the second mask film MF2 located immediately below the first mask film MF1. That is, when the first mask film MF1 is etched, it is possible to suppress the etching of the second mask film MF2.

When the first mask film MF1 is formed of an insulating material, the etching of the first mask film MF1 is performed using, for example, a fluorocarbon-based etching gas. In this case, it is possible to realize sufficiently high etching selectivity between the first mask film MF1 and the second mask film MF2 made of a metal material.

Meanwhile, such an effect is particularly remarkably obtained when the first mask film MF1 is formed of SiN and the second mask film MF2 is formed of TiN.

Next, as shown in FIG. 2B, the second mask film MF2 is etched using the photoresist PR1 as a mask. Thereby, an opening OP2 overlapping the opening OP1 is formed in the second mask film MF2. The etching thereof is performed by, for example, dry etching. In the present embodiment, the opening OP2 provided in the second mask film MF2 becomes a via pattern.

In the present embodiment, the hard mask film HM1 formed of an insulating material and the hard mask film HM1 formed of a metal material, amorphous silicon or polycrystalline silicon are alternately laminated. For this reason, it is possible to realize sufficiently high etching selectivity between the second mask film MF2 and the third mask film MF3 located immediately below the second mask film MF2. That is, when the second mask film MF2 is etched, it is possible to suppress the etching of the third mask film MF3.

When the second mask film MF2 is formed of a metal material, amorphous silicon, or polycrystalline silicon, the etching of the second mask film MF2 is performed using, for example, an etching gas containing chlorine. In this case, it is possible to realize sufficiently high etching selectivity of approximately 5 between the second mask film MF2 and the third mask film MF3 made of an insulating material.

Meanwhile, such an effect is particularly remarkably obtained when the second mask film MF2 is formed of TiN and the third mask film MF3 is formed of $SiO_2$.

Figure 3A:
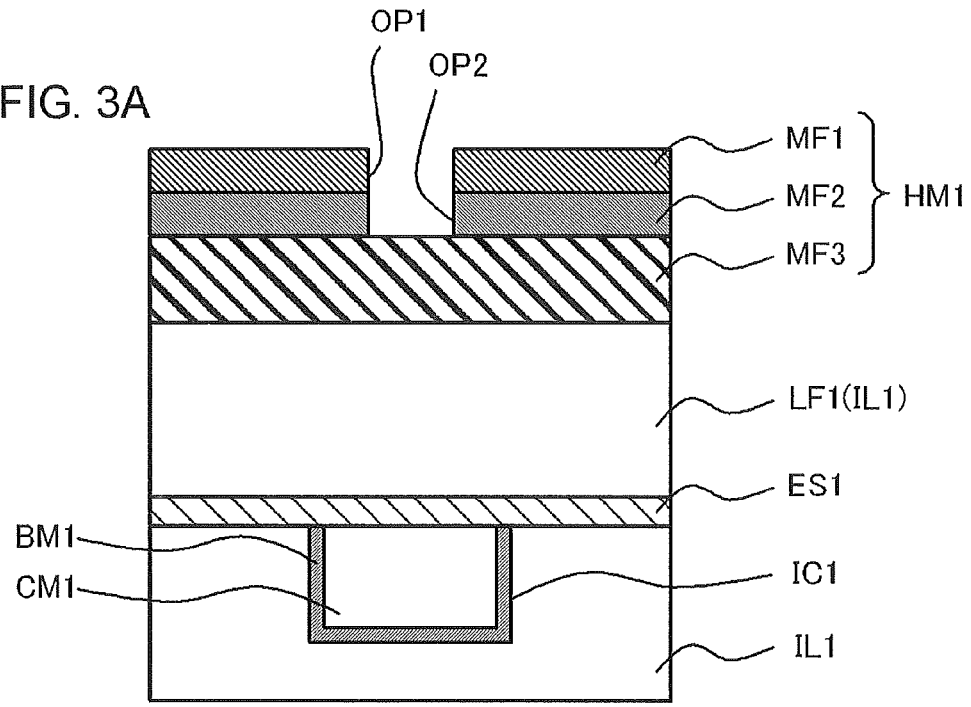
FIGS. 3A and 3B are cross-sectional views illustrating the method of manufacturing a semiconductor device according to the first embodiment.

Next, as shown in FIG. 3A, the photoresist PR1 and the antireflection film AR1 are removed. The photoresist PR1 and the antireflection film AR1 are removed by, for example, a plasma ashing process using an oxygen-containing gas.

According to the present embodiment, in the process of removing the photoresist PR1, the low dielectric constant film LF1 is covered with the third mask film MF3, and is not exposed from the opening OP2. For this reason, it is possible to suppress the occurrence of damage in the low dielectric constant film LF1 due to the ashing process.

Figure 3B:
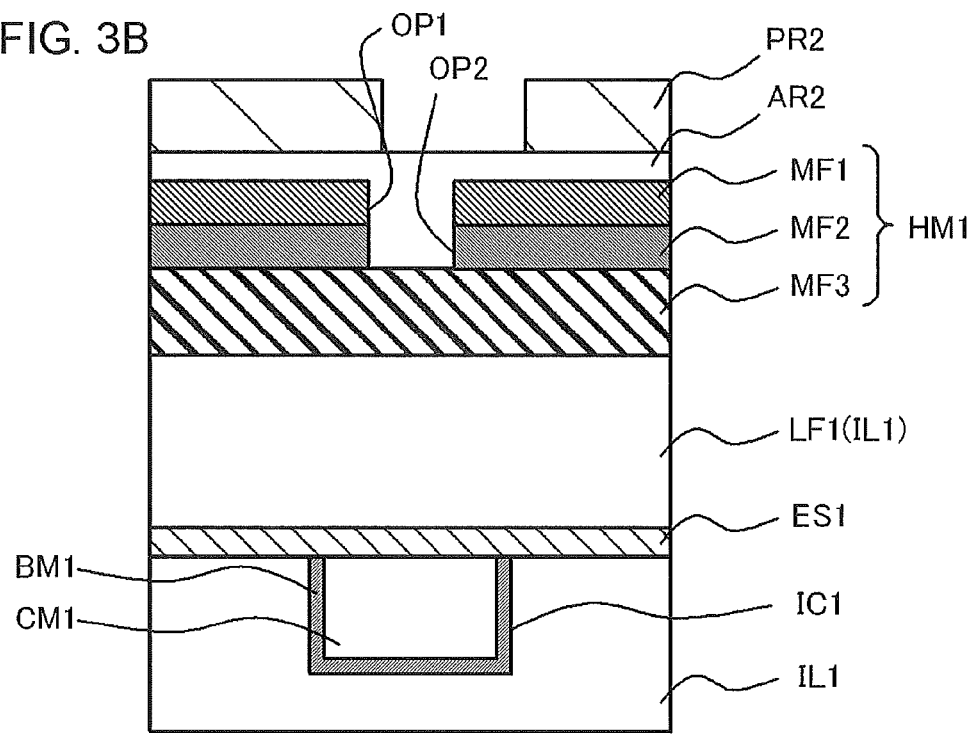

Next, as shown in FIG. 3B, an antireflection film AR2 and a photoresist PR2 are formed in order on the hard mask film HM1 having three layers. The antireflection film AR2 is provided, for example, so as to bury the opening OP1 and the opening OP2. Next, the photoresist PR2 is patterned by performing the exposure and development thereof.

Next, as shown in FIG. 4A, the antireflection film AR2 and the first mask film MF1 are etched using the photoresist PR2 as a mask. Thereby, a trench pattern constituted by the opening OP1 is formed in the first mask film MF1. The trench pattern is formed, for example, so that the via pattern formed in the second mask film MF2 is located on the inside of the trench pattern when seen in a plan view. In this case, the first mask film MF1 is etched so that the opening OP1 formed in the first mask film MF1 is expanded. The etching thereof is performed by, for example, dry etching.

Meanwhile, the trench pattern is a pattern for forming a trench in which the interconnect IC1 is buried. For this reason, the trench pattern is formed, for example, so as to be extended in one direction.

In the present embodiment, the hard mask film HM1 formed of an insulating material and the hard mask film HM1 formed of a metal material, amorphous silicon or polycrystalline silicon are alternately laminated. For this reason, it is possible to realize sufficiently high etching selectivity between the first mask film MF1 and the second mask film MF2 located immediately below the first mask film MF1. That is, when the first mask film MF1 is etched, it is possible to suppress the etching of the second mask film MF2. Therefore, it is possible to suppress the occurrence of a problem such as the causing of defective patterning due to the deformation of the via pattern by etching for forming the trench pattern.

After the process of forming the trench pattern in the first mask film MF1, the third mask film MF3 that covers the low dielectric constant film LF1 remains below the opening OP2. For this reason, it is possible to sufficiently suppress damage of the low dielectric constant film LF1 due to the ashing process of removing the photoresist PR2.

In the present embodiment, the third mask film MF3 has, for example, a larger thickness than that of the first mask film MF1. In addition, the third mask film MF3 is formed of, for example, a material which is not more likely to be etched than the first mask film MF1 in etching for forming a trench pattern in the first mask film MF1. With such a configuration, after the process of forming a trench pattern in the first mask film MF1, it is possible to cause the third mask film MF3 that covers the low dielectric constant film LF1 to sufficiently remain below the opening OP2.

When the first mask film MF1 is formed of an insulating material, the etching of the first mask film MF1 is performed using, for example, a fluorocarbon-based etching gas. In this case, it is possible to realize sufficiently high etching selectivity of equal to or more than 20 between the first mask film MF1 and the second mask film MF2 made of a metal material. Meanwhile, such an effect is particularly remarkable obtained when the first mask film MF1 is formed of SiN and the second mask film MF2 is formed of TiN.

In addition, when the first mask film MF1 is formed of SiN and the third mask film MF3 is formed of $SiO_2$, it is possible to realize high etching selectivity of approximately 3 between the first mask film MF1 and the third mask film MF3.

Meanwhile, in the present embodiment, after a via pattern is formed in the second mask film MF2, a trench pattern is formed in the first, mask film MF1. However, after the trench pattern is formed in the first mask film MF1, the via pattern may be formed in the second mask film MF2. In this case, the formation of each pattern can also be performed by etching using photoresist.

Next, as shown in FIG. 4B, the photoresist PR2 and the antireflection film AR2 are removed. The photoresist PR2 and the antireflection film AR2 are removed by, for example, a plasma ashing process using an oxygen-containing gas.

According to the present embodiment, in the process of removing the photoresist PR2, the low dielectric constant film LF1 is covered with the third mask film MF3, and is not exposed from the opening OP2. For this reason, it is possible to suppress the occurrence of damage in the low dielectric constant film LF1 due to the ashing process.

Figure 5A:
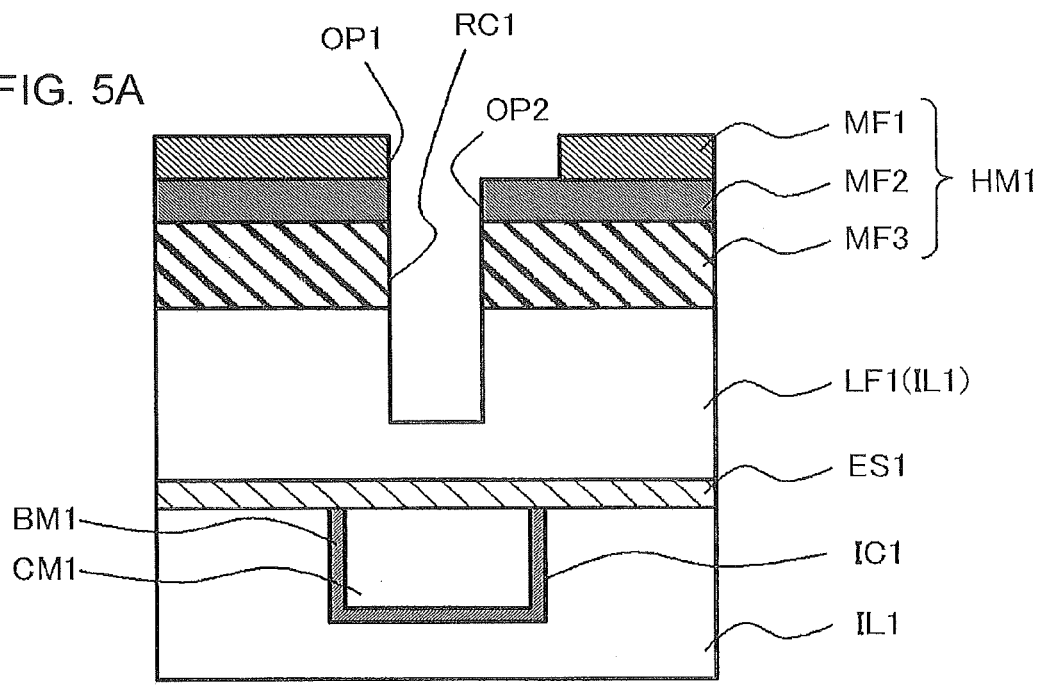
FIGS. 5A and 5B are cross-sectional views illustrating the method of manufacturing a semiconductor device according to the first embodiment.

Next, as shown in FIG. 5A, the third mask film MF3 constituting the hard mask film HM1 which is located as a lowermost layer and the low dielectric constant film LF1 are etched using the second mask film MF2 as a mask. Thereby, the recess RC1 which passes through the third mask film MF3 and leads to the low dielectric constant film LF1 is formed. The recess RC1 is formed, for example, so as not to pass through the low dielectric constant film LF1. The etching process is performed by, for example, dry etching.

Figure 5B:
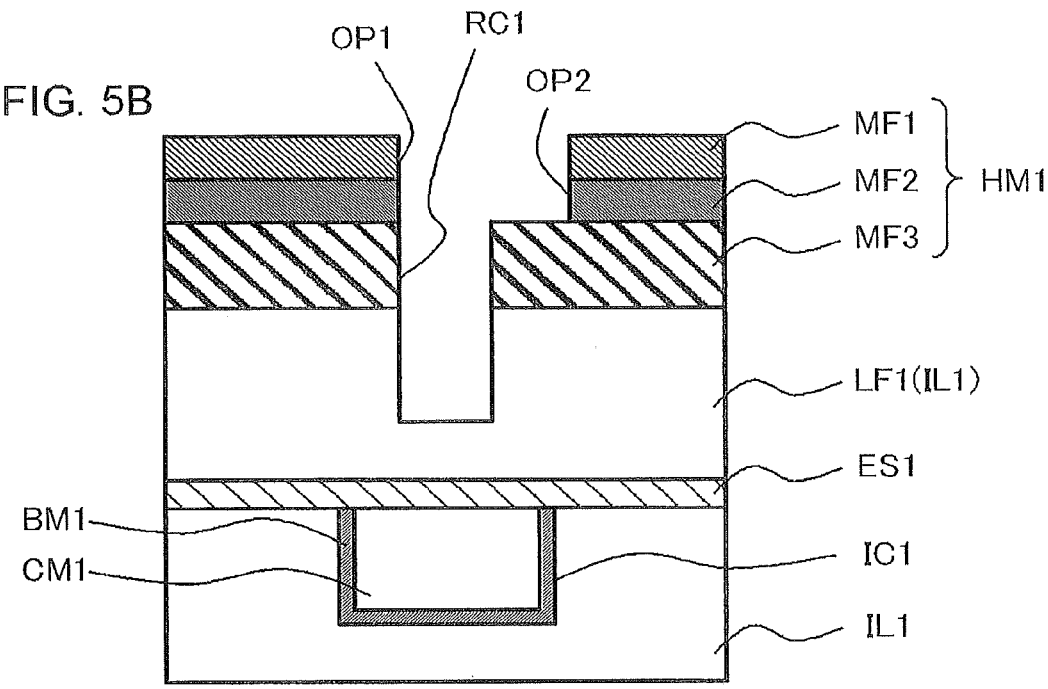

Next, as shown in FIG. 5B, the second mask film MF2 is etched using the first mask film MF1 as a mask. Thereby, the trench pattern formed in the first mask film MF1 is transferred to the second mask film MF2. In this case, the second mask film MF2 is etched so that the opening OP2 formed in the second mask film MF2 is expanded.

When the second mask film MF2 is formed of a metal material, amorphous silicon, or polycrystalline silicon, the etching of the second mask film MF2 is performed using, for example, an etching gas containing chlorine. In this case, it is possible to realize sufficiently high etching selectivity of approximately 5 between the second mask film MF2 and the third mask film MF3 made of an insulating material. In addition, it is possible to realize sufficiently high etching selectivity of approximately 5 even between the second mask film MF2 and the low dielectric constant film LF1.

Figure 6A:
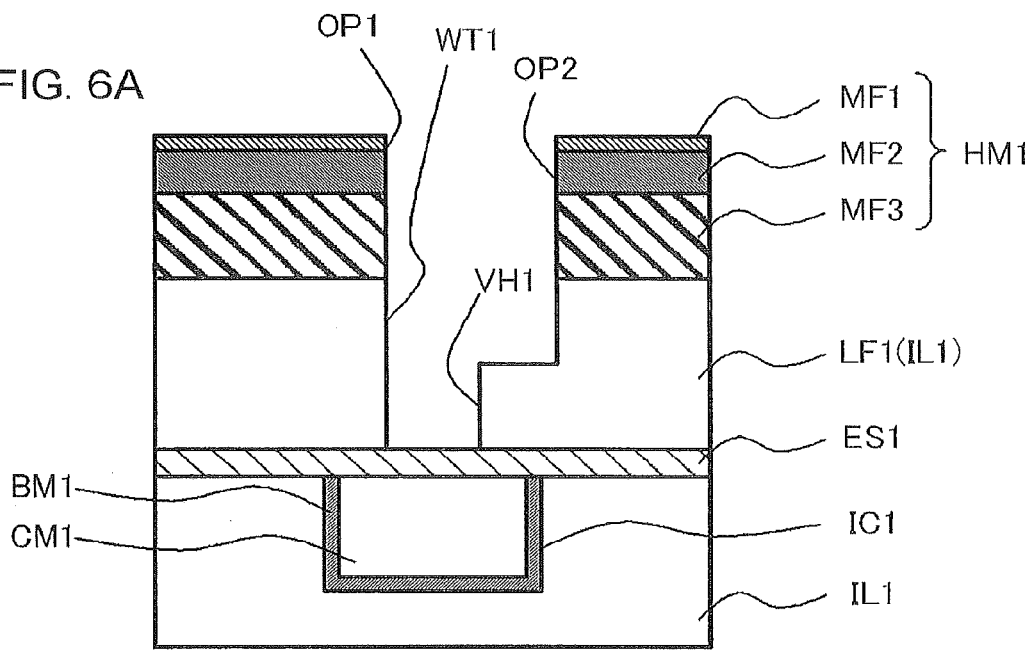
FIGS. 6A and 6B are cross-sectional views illustrating the method of manufacturing a semiconductor device according to the first embodiment.

Next, as shown in FIG. 6A, a portion located below the trench pattern in the third mask film MF3 is etched, and the low dielectric constant film LF1 is etched. Thereby, a via hole VH1 overlapping the recess RC1 and a trench WT1 which is located on the via hole VH1 and overlaps the trench pattern are formed in the low dielectric constant film LF1.

The process of etching the third mask film MF3 and the low dielectric constant film LF1 is performed, for example, using the first mask film MF1 and the second mask film MF2 as a mask. For this reason, a region overlapping the trench pattern transferred to the second mask film MF2 in the low dielectric constant film LF1 is etched. Thereby, the via hole VH1 reaching the etching stopper film ES1 is formed in a portion overlapping the recess RC1. In addition, the trench WT1 which includes the via hole VH1 on the inner side thereof when seen in a plan view and does not pass through the low dielectric constant film LF1 is formed on the via hole VH1.

Figure 6B:
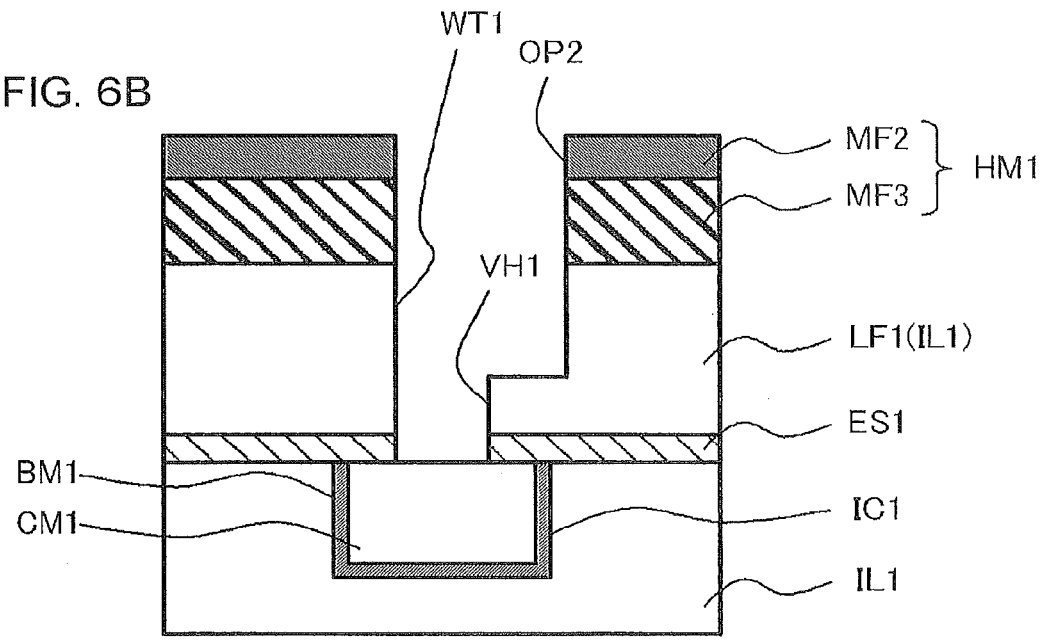

Next, as shown in FIG. 6B, a portion which is located below the via hole VH1 in the etching stopper film ES1 is removed by etching. Thereby, the via hole VH1 is connected to the interconnect IC1 provided at a lower layer.

Meanwhile, a portion of the low dielectric constant film LF1, for example, is further removed by this etching. Thereby, the depth of the trench WT1 becomes larger. In addition, the first mask film MF1, for example, is completely removed by this etching.

The process of etching the etching stopper film ES1 is performed using, for example, a fluorocarbon-based etching gas.

Figure 7A:
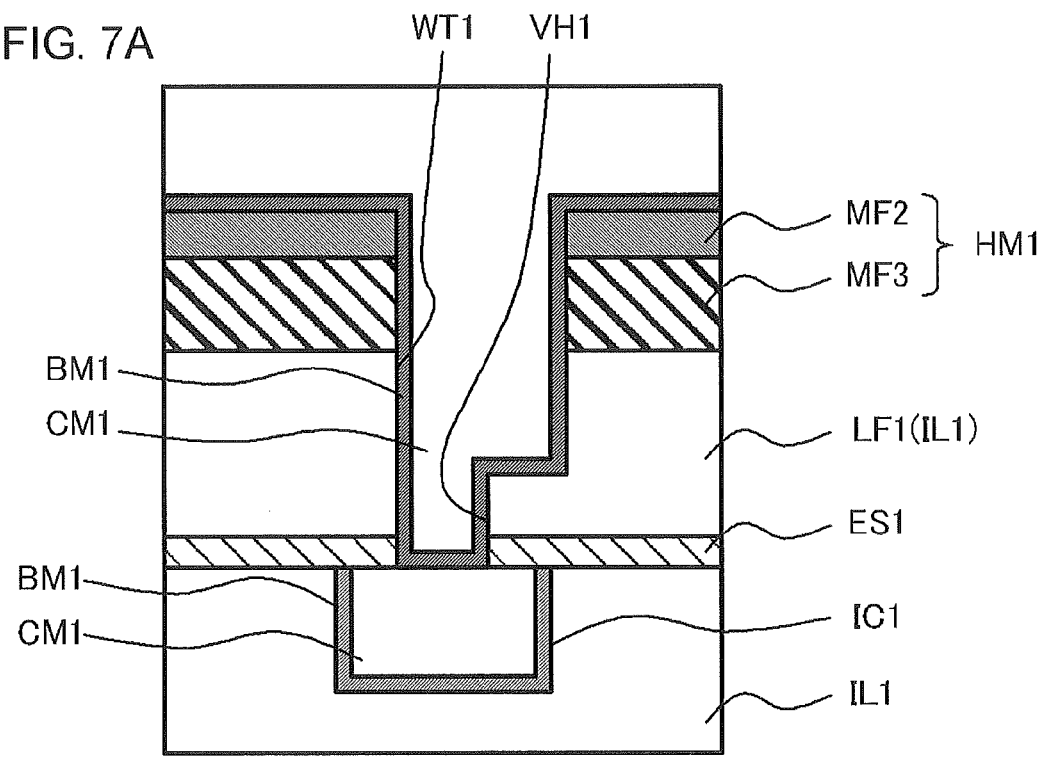
FIGS. 7A and 7B are cross-sectional views illustrating the method of manufacturing a semiconductor device according to the first embodiment.

Next, as shown in FIG. 7A, the conductive film CM1 is buried within the via hole VH1 and the trench WT1. The conductive film CM1 is formed on, for example, a barrier metal film BM1 that covers the inner walls of the via hole VH1 and the trench WT1.

In the present embodiment, the barrier metal film BM1 is formed on the inner walls of the via hole VH1 and the trench WT1, and the hard mask film HM1. In addition, the barrier metal film BM1 is constituted by, for example, a laminated film in which a TaN film and a Ta film are laminated in order.

The conductive film CM1 is formed of, for example, Cu. The conductive film CM1 is formed using a physical vapor deposition (PVD) method or a plating method. In addition, the conductive film CM1 may be constituted by a laminated film including a barrier Cu film formed by a PVD method and a Cu film formed on the barrier. Cu film by a plating method.

Figure 7B:
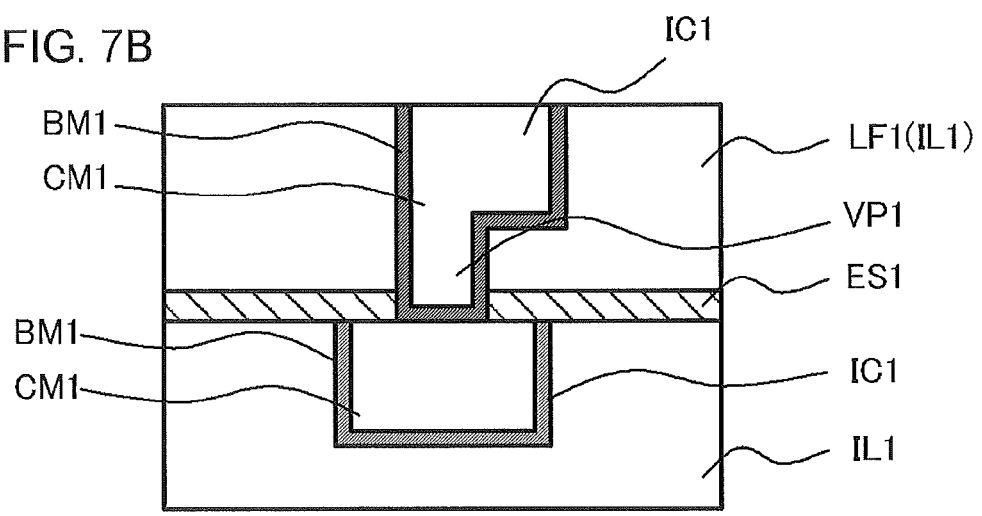

Next, as shown in FIG. 7B, a portion located outside the via hole VH1 and the trench WT1 in the barrier metal film BM1 and the conductive film CM1, and the remaining hard mask film HM1 are removed. Thereby, the via plug VP1 connected to the interconnect IC1 located on the lower layer, and the interconnect IC1 located on the via plug VP1 and connected to the via plug VP1 are formed. Meanwhile, the via plug VP1 is formed in the via hole VH1, and the interconnect IC1 is formed in the trench WT1.

The barrier metal film BM1, the conductive film CM1, and the hard mask film HM1 are removed by, for example, a chemical Mechanical Polishing (CMP) method. Here, for example, the barrier metal film BM1, the conductive film CM1, the second mask film MF2 and the third mask film MF3 are removed.

In the present embodiment, the second mask film MF2 can be caused to function as a stopper when the barrier metal film BM1 and the conductive film CM1 which are located on the second mask film MF2 are removed by a CMP method. In addition, the third mask film MF3 can be caused to function as a stopper when the second mask film MF2 is removed by the CMP method. Further, the low dielectric constant film LF1 can be caused to function as a stopper when the third mask film MF3 is removed by a CMP method. Therefore, according to the present embodiment, it is possible to form a high-accuracy interconnect structure.

According to the present embodiment, in this manner, each interconnect layer WL1 is obtained.

Next, an effect of the present embodiment will be described.

According to the present embodiment, the hard mask film HM1 having three layers is formed on the low dielectric constant film LF1. The hard mask film HM1 having three layers is constituted by the third mask film MF3 constituting the hard mask film HM1 which is located as a lowermost layer, the second mask film MF2 constituting the hard mask film HM1 which is located on the third mask film MF3, and the first mask film MF1 constituting the hard mask film HM1 which is located at an uppermost layer. After the trench pattern and the via pattern are formed in the first mask film MF1 and the second mask film MF2, respectively, by etching using a photoresist as a mask, the third mask film MF3 is etched using the second mask film MF2 as a mask. For this reason, when a photoresist is removed by an ashing process, the low dielectric constant film LF1 can be protected by the third mask film MF3. Therefore, it is possible to suppress damage due to the ashing process in the low dielectric constant film LF1.

In addition, the hard mask film HM1 having three layers is configured such that the hard mask film HM1 formed of an insulating material and the hard mask film HM1 formed of a metal material, amorphous silicon or polycrystalline silicon are alternately laminated. Thereby, it is possible to sufficiently secure etching selectivity between the hard mask films HM1 adjacent to each other. Therefore, it is possible to suppress the occurrence of defective patterning when the trench pattern and the via pattern are formed, and to realize high interconnect reliability.

As mentioned above, according to the present embodiment, it is possible to provide a method of manufacturing a semiconductor device which is capable of realizing high interconnect reliability while suppressing damage due to an ashing process.

Second Embodiment

FIGS. 9A and 9B to FIGS. 15A and 15B are cross-sectional views illustrating a method of manufacturing a semiconductor device SM1 according to a second embodiment, and correspond to FIGS. 1A and 1B to FIGS. 7A and 7B in the first embodiment.

In the method of manufacturing the semiconductor device SM1 according to the present embodiment, a process of forming each interconnect layer WL1 is performed using a hard mask film HM1 having four layers. Except for this point, the method of manufacturing the semiconductor device SM1 according to the present embodiment is the same as that in first embodiment.

Hereinafter, a method of forming each interconnect layer WL1 according to the present embodiment will be described.

Figure 9A:
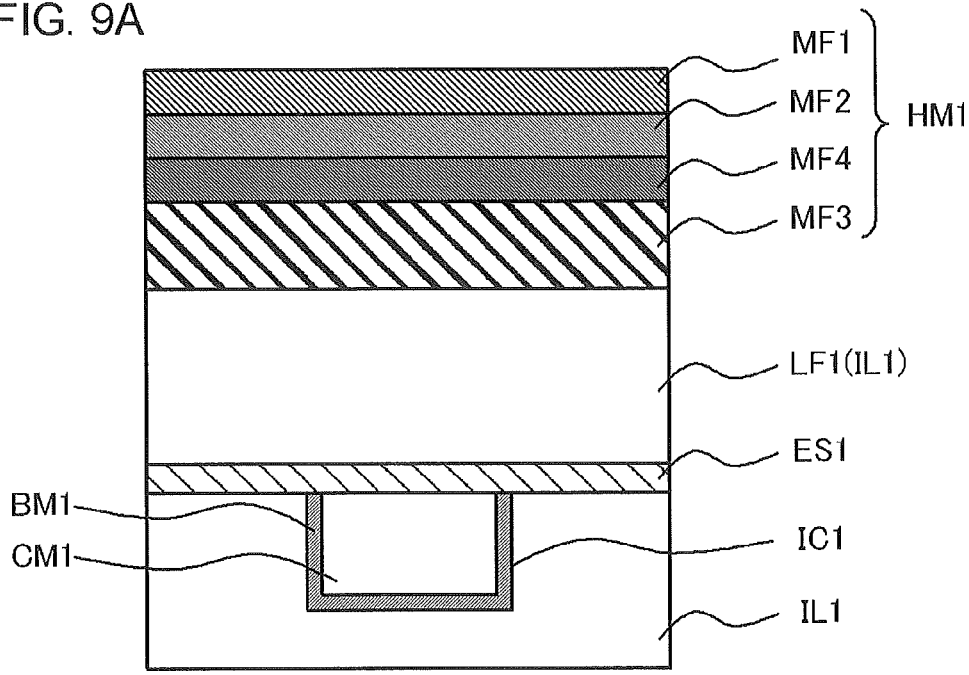
FIGS. 9A and 9B are cross-sectional views illustrating a method of manufacturing a semiconductor device according to a second embodiment.

First, as shown in FIG. 9A, the etching stopper film ES1 and the low dielectric constant film LF1 are formed in order on the insulating interlayer IL1 in which the interconnect IC1 is buried. The configurations of the low dielectric constant film LF1 and the etching stopper film ES1 are, for example, the same as those of the first embodiment.

Next, the hard mask film HM1 having at least three layers is formed on the low dielectric constant film LF1.

According to the present embodiment, the hard mask film HM1 having four layers is formed on the low dielectric constant film LF1. The hard mask film HM1 having four layers is constituted by a third mask film MF3 located as a lowermost layer, a fourth mask film MF4 located on the third mask film MF3, a second mask film MF2 located on the fourth mask film MF4, and a first mask film MF1 located at an uppermost layer. That is, the third mask film MF3, the fourth mask film MF4, the second mask film MF2, and the first mask film MF1 are laminated in order on the low dielectric constant film LF1, and thus the hard mask film HM1 having four layers is formed.

The hard mask film HM1 having four layers is configured such that the hard mask film HM1 formed of an insulating material and the hard mask film HM1 formed of a metal material, amorphous silicon or polycrystalline silicon are alternately laminated. Meanwhile, as the insulating material and the metal material constituting the hard mask film HM1, those shown in the first embodiment can be used.

It is possible to realize high etching selectivity between the hard mask film HM1 formed of an insulating material and the hard mask film HM1 formed of a metal material, amorphous silicon or polycrystalline silicon. For this reason, in a plurality of hard mask films HM1 laminated to each other, it is possible to sufficiently secure etching selectivity between the hard mask films HM1 adjacent to each other.

Therefore, in the present embodiment, it is also possible to suppress the occurrence of defective patterning when the trench pattern and the via pattern are formed.

In the present embodiment, for example, the second mask film MF2 and the third mask film MF3 are formed of an insulating material, and the first mask film MF1 and the fourth mask film MF4 are formed of a metal material, amorphous silicon or polycrystalline silicon. In this case, the third mask film MF3 made of an insulating material is formed on the low dielectric constant film LF1. For this reason, it is possible to improve adhesion between the hard mask film HM1 and the low dielectric constant film LF1. Therefore, it is possible to suppress the occurrence of a problem such as the peeling off of the hard mask film HM1 from the low dielectric constant film LF1.

In the present embodiment, the third mask film MF3 is also preferably formed of $SiO_2$. The third mask film MF3 functions as a protective film that protects the low dielectric constant film LF1 in an ashing process described later. The third mask film MF3 is formed of $SiO_2$, thereby allowing the low dielectric constant film LF1 to be more reliably protected when an ashing process using oxygen plasma is performed.

Meanwhile, the second mask film MF2 and the third mask film MF3 may be formed of a metal material, amorphous silicon or polycrystalline silicon, and the first mask film MF1 and the fourth mask film MF4 may be formed of an insulating material.

The thickness of the third mask film MF3 is, for example, equal to or more than 5 nm and equal to or less than 15 nm. The thickness of the fourth mask film MF4 is, for example, equal to or more than 5 nm and equal to or less than 15 nm. The thickness of the second mask film MF2 is, for example, equal to or more than 5 nm and equal to or less than 15 nm. The thickness of the first mask film MF1 is, for example, equal to or more than 5 nm and equal to or less than 15 nm.

Such a film thickness is selected, thereby allowing a function as a hard mask to be sufficiently realized. In addition, it is possible to suppress the occurrence of a problem such as the difficulty of performing removal due to an excessive increase in the thickness of the hard mask film HM1.

In addition, according to the present embodiment, the first mask film MF1 in which a trench pattern is formed by etching using a photoresist is formed of a metal material, amorphous silicon or polycrystalline silicon, and the third mask film MF3 is formed of an insulating material. For this reason, in a process, described later, of forming a trench pattern in the first mask film MF1, it is possible to realize high etching selectivity between the first mask film MF1 and the third mask film MF3. That is, when the trench pattern is formed in the first mask film MF1, it is possible to suppress the cutoff of a portion which is exposed from the via pattern in the third mask film MF3.

Therefore, according to the present embodiment, even when the thickness of the third mask film MF3 is further reduced than in the first embodiment, it is possible to sufficiently secure a function as a protective film, included in the third mask film MF3, at the time of the ashing process.

Next, the etching of the hard mask film HM1 using a photoresist as a mask and the ashing process of removing the photoresist are repeated. Thereby, a trench pattern is formed in the first mask film MF1, and a via pattern located on the inside of the trench pattern when seen in a plan view is formed in the second mask film MF2. Hereinafter, processes of forming the trench pattern and the via pattern will be described in detail.

Figure 9B:
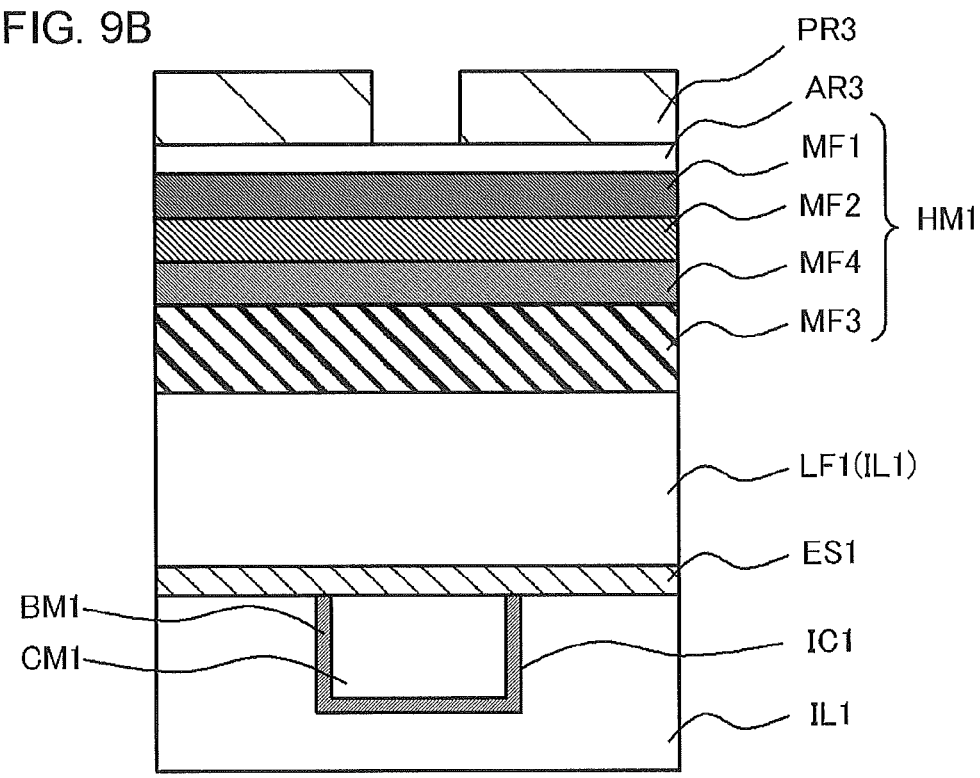

First, as shown in FIG. 9B, an antireflection film AR3 and a photoresist PR3 are formed in order on the hard mask film HM1 having four layers. Next, the photoresist PR3 is patterned by performing the exposure and development thereof.

Next, as shown in FIG. 10A, the antireflection film AR3, the first mask film MF1, the second mask film MF2 and the fourth mask film MF4 are etched using the photoresist PR3 as a mask. Thereby, an opening OP1 is formed in the first mask film MF1, an opening OP2 is formed in the second mask film MF2, and an opening OP4 is formed in the fourth mask film MF4. The etching thereof is performed by, for example, dry etching. In the present embodiment, the opening OP2 provided in the second mask film MF2 and the opening OP4 provided in the fourth mask film MF4 become via patterns.

In the present embodiment, the hard mask film HM1 formed of an insulating material and the hard mask film HM1 formed of a metal material, amorphous silicon or polycrystalline silicon are alternately laminated. For this reason, when the first mask film MF1, the second mask film MF2 and the fourth mask film MF4 are etched, it is possible to suppress the etching of each hard mask film HM1 located at a lower layer.

When the first mask film MF1 is formed of a metal material, amorphous silicon, or polycrystalline silicon, the etching of the first mask film MF1 is performed using, for example, an etching gas containing chlorine. In this case, it is possible to realize sufficiently high etching selectivity between the first mask film MF1 and the second mask film MF2 formed of an insulating material.

When the second mask film MF2 is formed of an insulating material, the etching of the second mask film MF2 is performed using, for example, a fluorocarbon-based etching gas. In this case, it is possible to realize sufficiently high etching selectivity between the second mask film MF2 and the fourth mask film MF4 formed of a metal material.

When the fourth mask film MF4 is formed of a metal material, amorphous silicon, or polycrystalline silicon, the etching of the fourth mask film MF4 is performed using, for example, an etching gas containing chlorine. In this case, it is possible to realize sufficiently high etching selectivity between the fourth mask film MF4 and the third mask film MF3 formed of an insulating material.

Next, as shown in FIG. 10B, the photoresist PR3 and the antireflection film AR3 are removed. The photoresist PR3 and the antireflection film AR3 are removed by, for example, a plasma ashing process using an oxygen-containing gas.

According to the present embodiment, in the process of removing the photoresist PR3, the low dielectric constant film LF1 is covered with the third mask film MF3, and is not exposed from via patterns constituted by the opening OP2 and the opening OP4. For this reason, it is possible to suppress the occurrence of damage in the low dielectric constant film LF1 due to the asking process.

Next, as shown in FIG. 11A, an antireflection film AR4 and a photoresist PR4 are formed in order on the hard mask film HM1 having four layers. The antireflection film AR4 is provided, for example, so as to bury the opening OP1, the opening OP2 and the opening OP4. Next, the photoresist PR4 is patterned by performing the exposure and development thereof.

Next, as shown in FIG. 11B, the antireflection film AR4 and the first mask film MF1 are etched using the photoresist PR4 as a mask. Thereby, a trench pattern constituted by the opening OP1 is formed in the first mask film MF1. The trench pattern is formed, for example, so that the via pattern formed in the second mask film MF2 is located on the inside of the trench pattern when seen in a plan view. In this case, the first mask film MF1 is etched so that the opening OP1 formed in the first mask film MF1 is expanded. The etching thereof is performed by, for example, dry etching.

Meanwhile, the trench pattern is a pattern for forming a trench in which the interconnect IC1 is buried. For this reason, the trench pattern is formed, for example, so as to be extended in one direction.

In the present embodiment, the hard mask film HM1 formed of an insulating material and the hard mask film HM1 formed of a metal material, amorphous silicon or polycrystalline silicon are alternately laminated. For this reason, it is possible to realize sufficiently high etching selectivity between the first mask film MF1 and the second mask film MF2 located immediately below the first mask film MF1. That is, when the first mask film MF1 is etched, it is possible to suppress the etching of the second mask film MF2. Therefore, it is possible to suppress the occurrence of a problem such as the causing of defective patterning due to the deformation of the via pattern by etching for forming the trench pattern.

After the process of forming a trench pattern in the first mask film MF1, the third mask film MF3 that covers the low dielectric constant film LF1 remains below the via pattern constituted by the opening OP2 and the opening OP4. For this reason, it is possible to sufficiently suppress damage of the low dielectric constant film LF1 due to the ashing process of removing the photoresist PR4.

In addition, according to the present embodiment, the first mask film MF1 in which a trench pattern is formed is formed of a metal material, amorphous silicon or polycrystalline silicon, and the third mask film MF3 is formed of an insulating material. For this reason, in the process of forming a trench pattern in the first mask film MF1, it is possible to realize high etching selectivity between the first mask film MF1 and the third mask film MF3. That is, when the trench pattern is formed in the first mask film MF1, it is possible to suppress the cutoff of a portion which is exposed from the via pattern in the third mask film MF3. Therefore, even after the process of forming a trench pattern in the first mask film MF1, it is easy to cause the third mask film MF3 that covers the low dielectric constant film LF1 to remain below the via pattern.

When the first mask film MF1 is formed of a metal material, amorphous silicon or polycrystalline silicon, the etching of the first mask film MF1 is performed using, for example, an etching gas containing chlorine. In this case, it is possible to realize sufficiently high etching selectivity of equal to or more than 20 between the first mask film MF1, and the second mask film MF2 and the third mask film MF3, which are formed of an insulating material.

Meanwhile, in the present embodiment, after a via pattern is formed in the second mask film MF2 and the fourth mask film MF4, a trench pattern is formed in the first mask film MF1. However, after the trench pattern is formed in the first mask film MF1, the via pattern may be formed in the second mask film MF2 and the fourth mask film MF4. In this case, the formation of each pattern can also be performed by etching using a photoresist.

Next, as shown in FIG. 12A, the photoresist PR4 and the antireflection film AR4 are removed. The photoresist PR4 and the antireflection film AR4 are removed by, for example, a plasma ashing process using an oxygen-containing gas.

According to the present embodiment, in the process of removing the photoresist PR4, the low dielectric constant film LF1 is covered with the third mask film MF3, and is not exposed from the via pattern constituted by the opening OP2 and the opening OP4. For this reason, it is possible to suppress the occurrence of damage in the low dielectric constant film LF1 due to the ashing process.

Next, as shown in FIG. 12B, the third mask film MF3 constituting the hard mask film HM1 which is located as a lowermost layer and the low dielectric constant film LF1 are etched using the second mask film MF2 as a mask. Thereby, the recess RC1 which passes through the third mask film MF3 and leads to the low dielectric constant film LF1 is formed. The recess RC1 is formed, for example, so as not to pass through the low dielectric constant film LF1. The etching process is performed by, for example, dry etching.

Figure 13A:
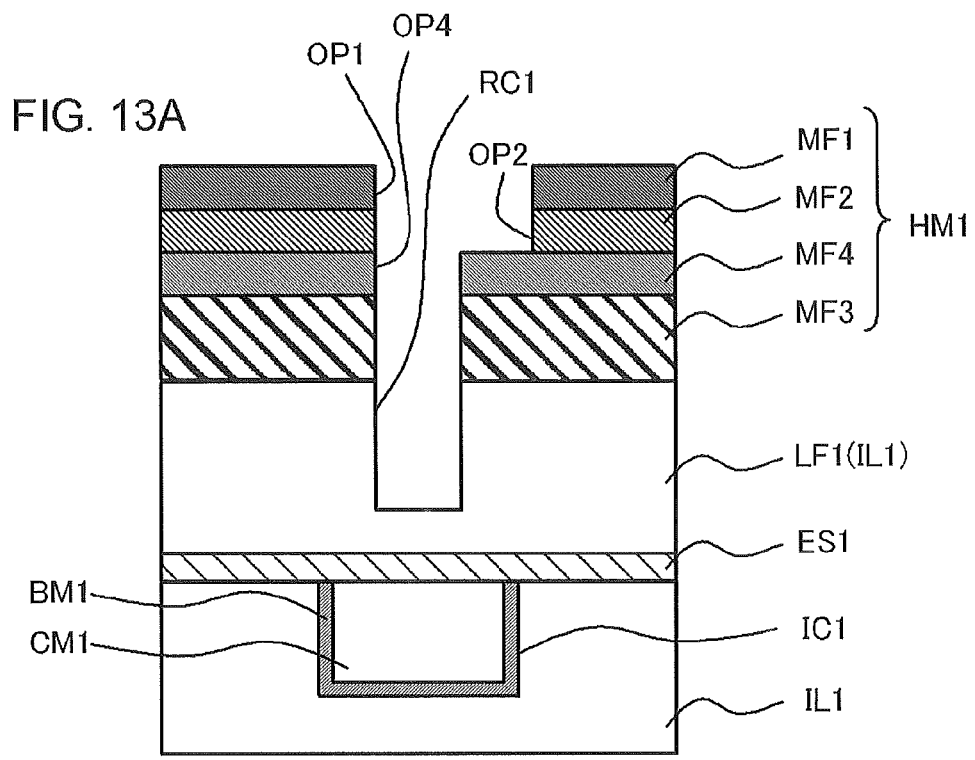
FIGS. 13A and 13B are cross-sectional views illustrating a method of manufacturing a semiconductor device according to the second embodiment.

Next, as shown in FIG. 13A, the second mask film MF2 is etched using the first mask film MF1 as a mask. Thereby, the trench pattern formed in the first mask film MF1 is transferred to the second mask film MF2. In this case, the second mask film MF2 is etched so that the opening OP2 formed in the second mask film MF2 is expanded.

Meanwhile, in this etching process, a portion of the low dielectric constant film LF1 located below the recess RC1 may be removed. In this case, the depth of the recess RC1 can be controlled so that the etching stopper film ES1 is not exposed in this etching process.

Figure 13B:
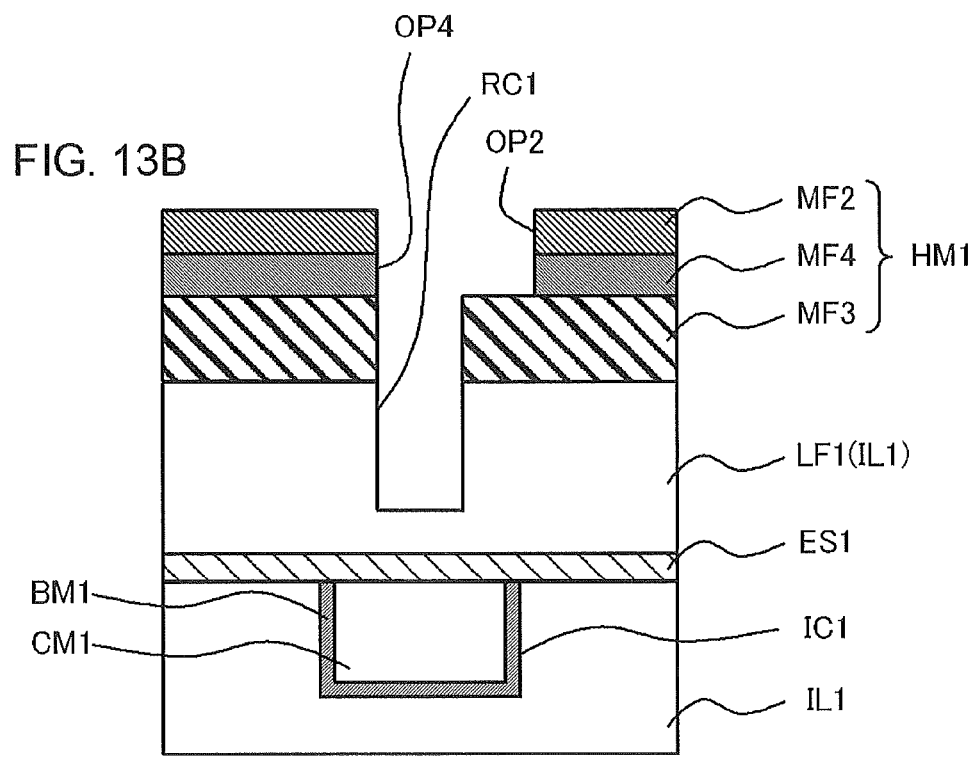

In addition, when the second mask film MF2 is formed of an insulating material, the etching of the second mask film MF2 is performed using, for example, a fluorocarbon-based etching gas Next, as shown in FIG. 13B, the fourth mask film MF4 is etched using the second mask film MF2 as a mask. Thereby, the trench pattern formed in the second mask film MF2 is transferred to the fourth mask film MF4. In this case, the fourth mask film MF4 is etched so that the opening OP4 formed in the fourth mask film MF4 is expanded. Meanwhile, the first mask film MF1 may be removed by this etching process.

In addition, when the fourth mask film MF4 is formed of a metal material, amorphous silicon, or polycrystalline silicon, the etching of the fourth mask film MF4 is performed using, for example, an etching gas containing chlorine.

Figure 14A:
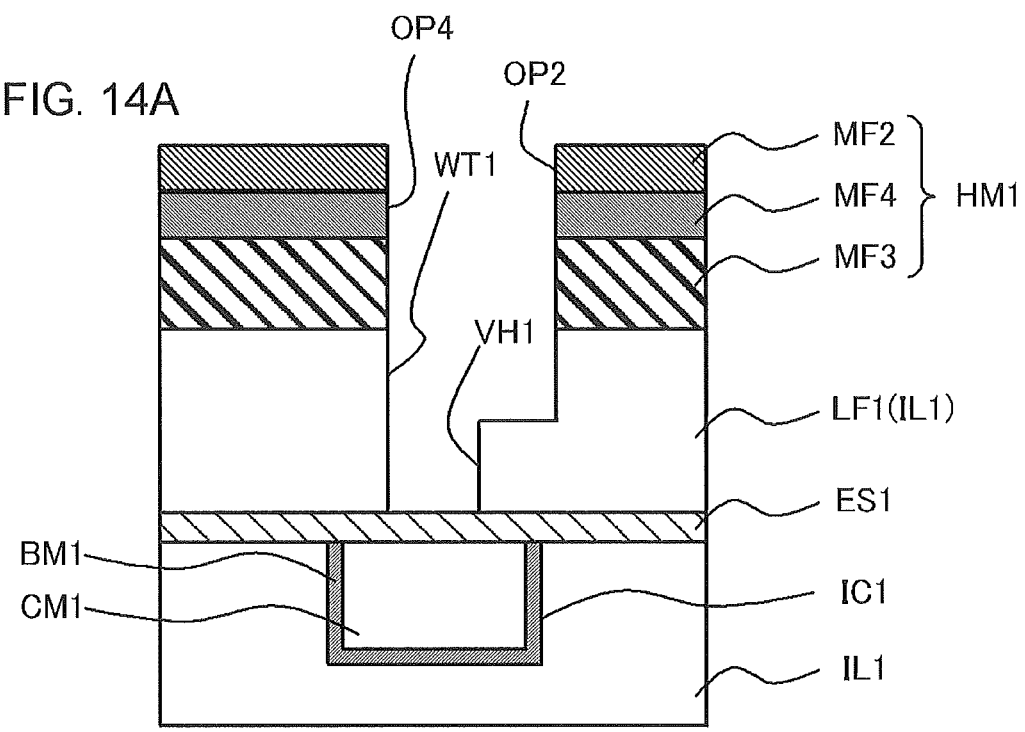
FIGS. 14A and 14B are cross-sectional views illustrating a method of manufacturing a semiconductor device according to the second embodiment.

Next, as shown in FIG. 14A, a portion located below the trench pattern in the third mask film MF3 is etched, and the low dielectric constant film LF1 is etched. Thereby, a via hole VH1 overlapping the recess RC1 and a trench WT1 which is located on the via hole VH1 and overlaps the trench pattern are formed in the low dielectric constant film LF1.

The process of etching the third mask film MF3 and the low dielectric constant film LF1 is performed, for example, using the second mask film MF2 and the fourth mask film MF4 as a mask. For this reason, a region overlapping the trench pattern transferred to the second mask film MF2 and the fourth mask film MF4 in the low dielectric constant film LF1 is etched. Thereby, the via hole VH1 reaching the etching stopper film ES1 is formed in a portion overlapping the recess RC1. In addition, the trench WT1 which includes the via hole VH1 on the inner side thereof when seen in a plan view and does not pass through the low dielectric constant film LF1 is formed on the via hole VH1.

Figure 14B:
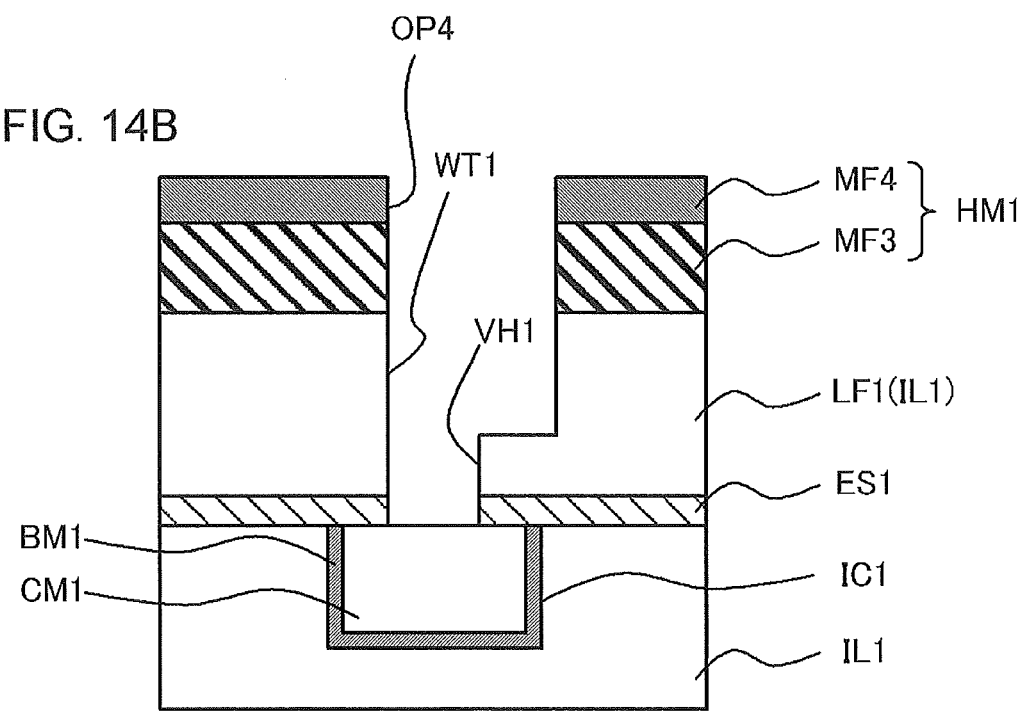

Next, as shown in FIG. 14B, a portion which is located below the via hole VH1 in the etching stopper film ES1 is removed by etching. Thereby, the via hole VH1 is connected to the interconnect IC1 provided at a lower layer. This etching process is performed using, for example, a fluorocarbon-based etching gas.

In addition, when the etching stopper film ES1 and the second mask film MF2 are all formed of SiN, the second mask film MF2 is removed by, for example, this etching process.

Figure 15A:
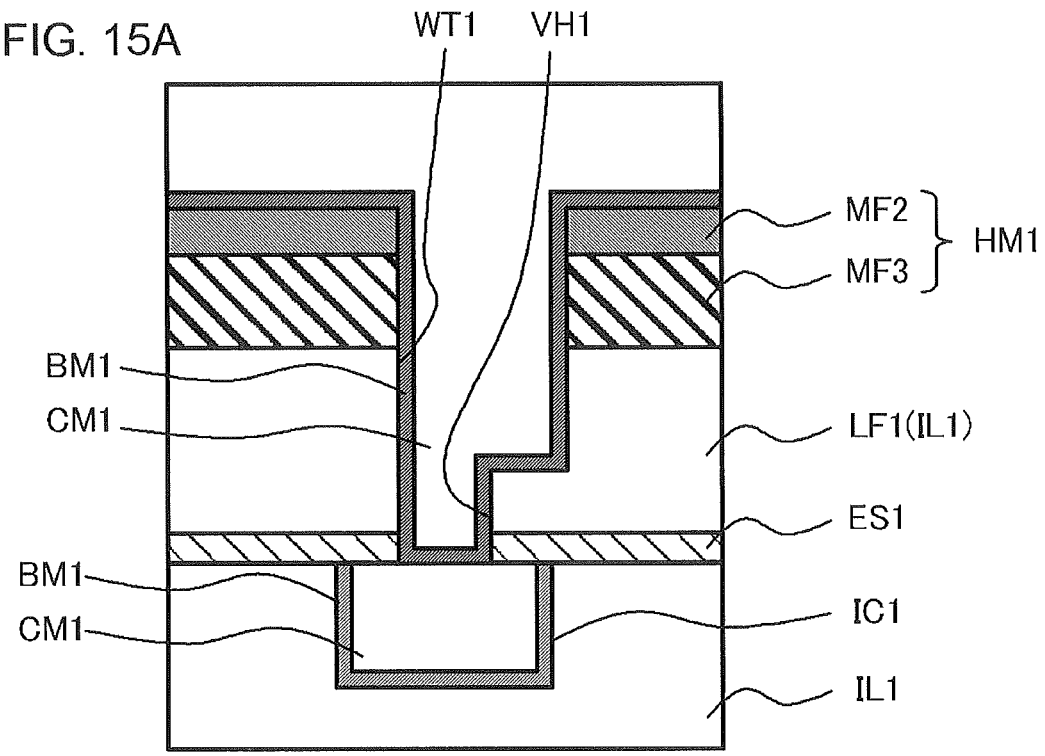
FIGS. 15A and 15B are cross-sectional views illustrating a method of manufacturing a semiconductor device according to the second embodiment.

Next, as shown in FIG. 15A, the conductive film CM1 is buried within the via hole VH1 and the trench WT1. The conductive film CM1 is formed on, for example, a barrier metal film BM1 that covers the inner walls of the via hole VH1 and the trench WT1. The conductive film CM1 and the barrier metal film BM1 have the same configurations as in, for example, the first embodiment.

Figure 15B:
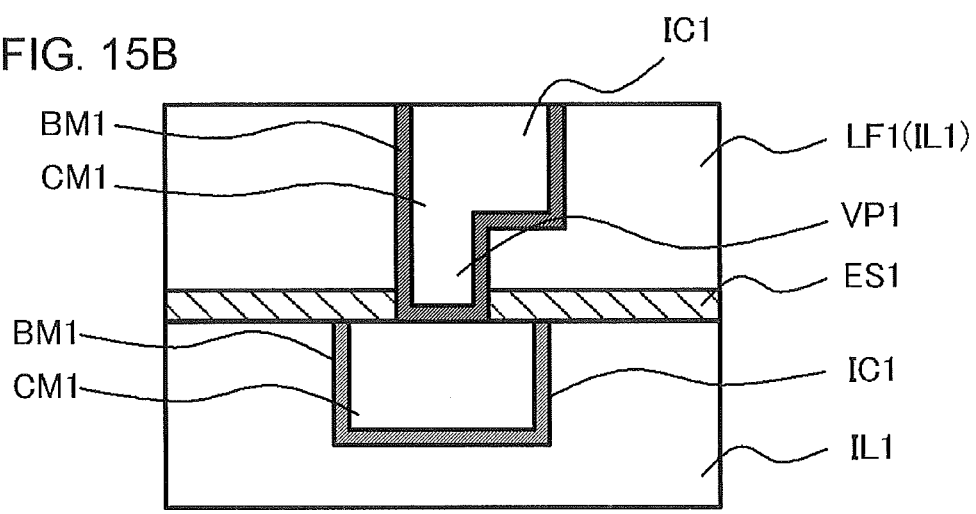

Next, as shown in FIG. 15B, a portion located outside the via hole VH1 and the trench WT1 in the barrier metal film BM1 and the conductive film CM1, and the remaining hard mask film HM1 are removed. Thereby, the via plug VP1 connected to the interconnect IC1 located on the lower layer, and the interconnect IC1 located on the via plug VP1 and connected to the via plug VP1 are formed. Meanwhile, the via plug VP1 is formed in the via hole VH1, and the interconnect IC1 is formed in the trench WT1. Here, for example, the barrier metal film BM1, the conductive film CM1, the second mask film MF2 and the third mask film MF3 are removed.

According to the present embodiment, in this manner, each interconnect layer WL1 is obtained.

In the present embodiment, it is possible to obtain the same effect as in the first embodiment.

Third Embodiment

FIGS. 16A and 16B to FIGS. 20A and 20B are cross-sectional views illustrating a method of manufacturing a semiconductor device SM1 according to a third embodiment, and correspond to FIGS. 1A and 1B to FIGS. 7A and 7B in the first embodiment.

In the method of manufacturing the semiconductor device SM1 according to the present embodiment, a process of forming each interconnect layer WL1 is performed using a hard mask film HM1 having five layers. In addition, after a trench pattern is formed in the hard mask film HM1, a via pattern is formed. Meanwhile, the configuration of the semiconductor device SM1 according to the present embodiment is the same as that of the first embodiment.

Hereinafter, a method of forming each interconnect layer WL1 according to the present embodiment will be described.

Figure 16A:
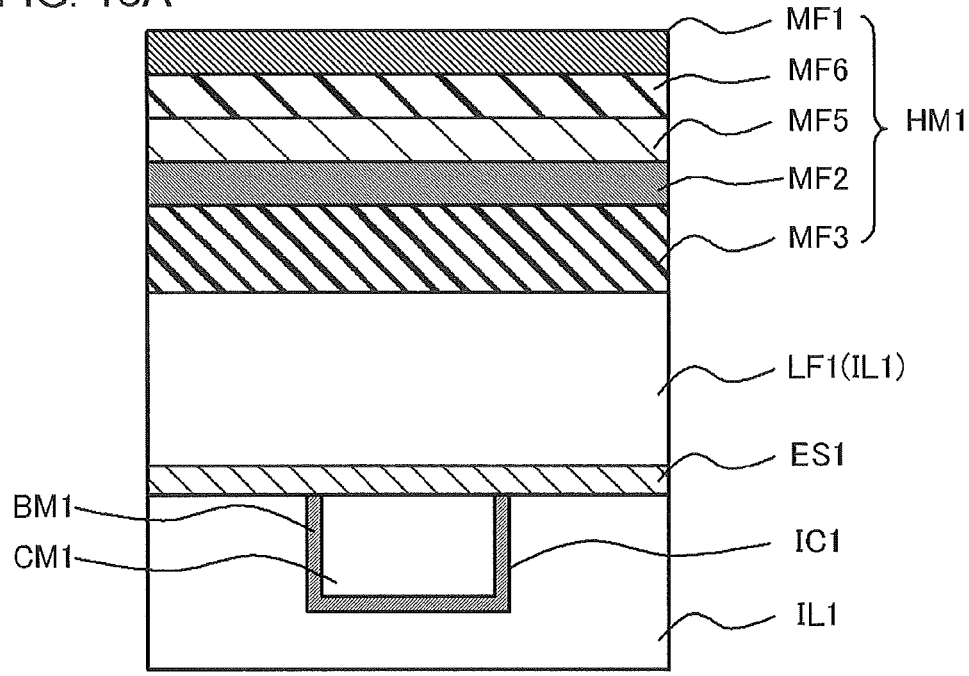
FIGS. 16A and 16B are cross-sectional views illustrating a method of manufacturing a semiconductor device according to a third embodiment.

First, as shown in FIG. 16A, the etching stopper film ES1 and the low dielectric constant film LF1 are formed in order on the insulating interlayer IL1 in which the interconnect IC1 is buried. The configurations of the low dielectric constant film LF1 and the etching stopper film ES1 are, for example, the same as those of the first embodiment.

Next, a hard mask film HM1 having at least three layers is formed on the low dielectric constant film LF1.

In the present embodiment, the hard mask film HM1 having five layers is formed on the low dielectric constant film LF1. The hard mask film HM1 having five layers is constituted by a third mask film MF3 located as a lowermost layer, a second mask film MF2 located on the third mask film MF3, a fifth mask film MF5 located on a second mask film MF2, a sixth mask film MF6 located on the fifth mask film MF5, and a first mask film MF1 located at an uppermost layer. That is, the third mask film MF3, second mask film MF2, the fifth mask film MF5, the sixth mask film MF6, and the first mask film MF1 are laminated in order on the low dielectric constant film LF1, and thus the hard mask film HM1 having five layers is formed.

The hard mask film HM1 having five layers is configured such that the hard mask film HM1 formed of an insulating material and the hard mask film HM1 formed of a metal material, amorphous silicon or polycrystalline silicon are alternately laminated. Meanwhile, as the insulating material and the metal material constituting the hard mask film HM1, those shown in the first embodiment can be used.

It is possible to realize high etching selectivity between the hard mask film HM1 formed of an insulating material and the hard mask film HM1 formed of a metal material, amorphous silicon or polycrystalline silicon. For this reason, in a plurality of hard mask films HM1 laminated to each other, it is possible to sufficiently secure etching selectivity between the hard mask films HM1 adjacent to each other.

Therefore, in the present embodiment, it is also possible to suppress the occurrence of defective patterning when the trench pattern and the via pattern are formed.

In the present embodiment, for example, the first mask film MF1, the third mask film MF3 and the fifth mask film MF5 are formed of an insulating material, and the second mask film MF2 and the sixth mask film MF6 are formed of a metal material, amorphous silicon or polycrystalline silicon. In this case, the third mask film MF3 made of an insulating material is formed on the low dielectric constant film LF1. For this reason, it is possible to improve adhesion between the hard mask film HM1 and the low dielectric constant film LF1. Therefore, it is possible to suppress the occurrence of a problem such as the peeling off of the hard mask film HM1 from the low dielectric constant film LF1.

In the present embodiment, the third mask film MF3 is also preferably formed of $SiO_2$. The third mask film MF3 functions as a protective film that protects the low dielectric constant film LF1 in an ashing process described later. The third mask film MF3 is formed of $SiO_2$, thereby allowing the low dielectric constant film LF1 to be more reliably protected when an ashing process using oxygen plasma is performed.

In the present embodiment, for example, the third mask film MF3 is formed of $SiO_2$, the fifth mask film MF5 is formed of SiN, and the first mask film MF1 is formed of $SiO_2$. Meanwhile, the materials constituting the first mask film MF1, the third mask film MF3 and the fifth mask film MF5 are not limited to the combination thereof. For example, these films may be formed of the same material as each other.

Meanwhile, the first mask film MF1, the third mask film MF3 and the fifth mask film MF5 may be formed of a metal material, amorphous silicon or polycrystalline silicon, and the second mask film MF2 and the sixth mask film MF6 may be formed of an insulating material.

Next, the etching of the hard mask film HM1 using a photoresist as a mask and the asking process of removing the photoresist are repeated. Thereby, a trench pattern is formed in the first mask film MF1, and a via pattern located on the inside of the trench pattern when seen in a plan view is formed in the second mask film MF2. Hereinafter, the process of forming the trench pattern and the via pattern will be described in detail.

Figure 16B:
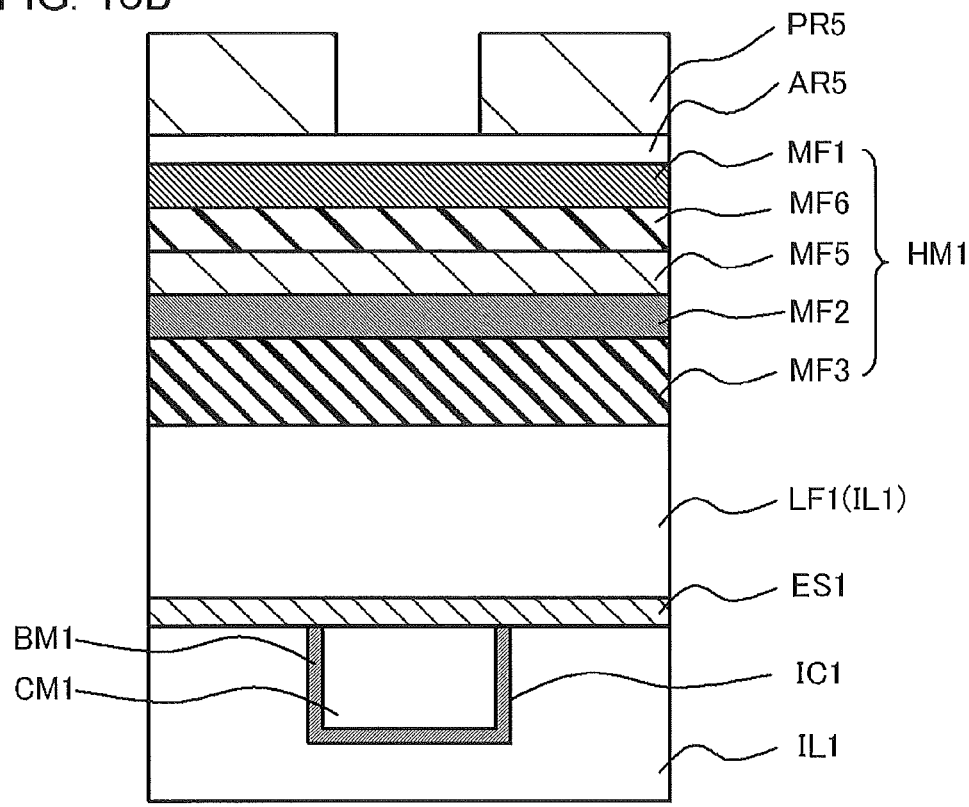

First, as shown in FIG. 16B, an antireflection film AR5 and a photoresist PR5 are formed in order on the hard mask film HM1 having five layers. Next, the photoresist PR5 is patterned by performing the exposure and development thereof.

Figure 17A:
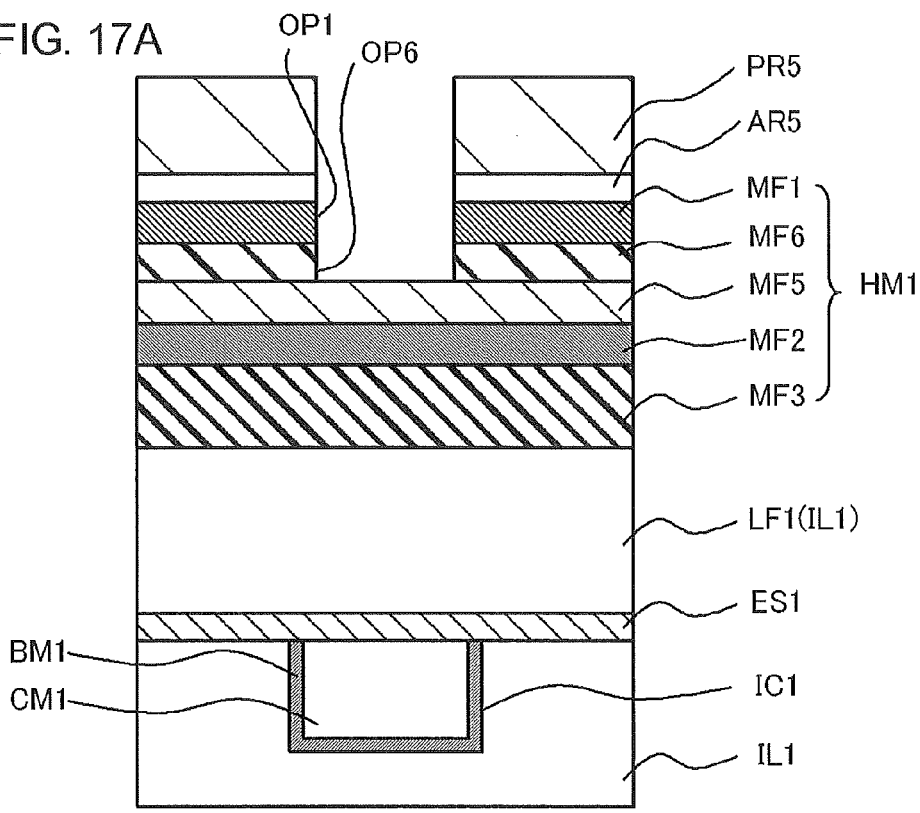
FIGS. 17A and 17B are cross-sectional views illustrating a method of manufacturing a semiconductor device according to the third embodiment.

Next, as shown in FIG. 17A, the antireflection film AR5, the first mask film MF1, and the sixth mask film MF6 are etched using the photoresist PR5 as a mask. Thereby, on opening OP1 is formed in the first mask film MF1, and an opening OP6 is formed in the sixth mask film MF6. The etching thereof is performed by, for example, dry etching. In the present embodiment, the opening OP1 provided in the first mask film MF1 and the opening OP6 provided in the sixth mask film MF6 become trench patterns.

Meanwhile, the trench pattern is a pattern for forming a trench in which the interconnect IC1 is buried. For this reason, the trench pattern is formed, for example, so as to be extended in one direction.

In the present embodiment, the hard mask film HM1 formed of an insulating material and the hard mask film HM1 formed of a metal material, amorphous silicon or polycrystalline silicon are alternately laminated. For this reason, when the first mask film MF1 and the sixth mask film MF6 are etched, it is possible to suppress the etching of each hard mask film HM1 located at a lower layer.

When the first mask film MF1 is formed of an insulating material, the etching of the first mask film MF1 is performed using, for example, a fluorocarbon-based etching gas. In this case, it is possible to realize sufficiently high etching selectivity between the first mask film MF1 and the sixth mask film MF6 formed of a metal material.

When the sixth mask film MF6 is formed of a metal material, amorphous silicon, or polycrystalline silicon, the etching of the sixth mask film MF6 is performed using, for example, an etching gas containing chlorine. In this case, it is possible to realize sufficiently high etching selectivity between the sixth mask film MF6 and the fifth mask film MF5 formed of an insulating material.

Figure 17B:
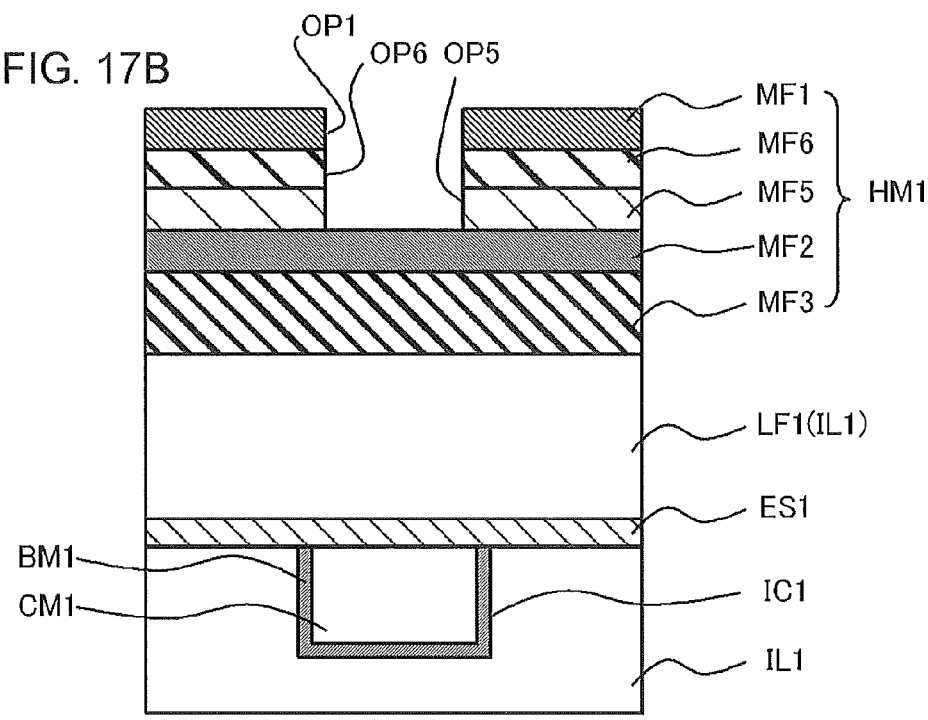

Next, as shown in FIG. 17B, the photoresist PR5 and the antireflection film AR5 are removed. The photoresist PR5 and the antireflection film AR5 are removed by, for example, a plasma ashing process using an oxygen-containing gas.

Next, the fifth mask film MF5 is etched using the first mask film MF1 as a mask. Thereby, an opening OP5 is formed in the fifth mask film MF5. In the present embodiment, for example, the first mask film MF1 is formed of $SiO_2$, and the fifth mask film MF5 is formed of SiN. For this reason, it is possible to realize high etching selectivity between the first mask film MF1 and the fifth mask film MF5. Meanwhile, when the first mask film MF1 and the fifth mask film MF5 are formed of the same material as each other, the fifth mask film MF5 may be etched using the photoresist PR5 as a mask.

Figure 18A:
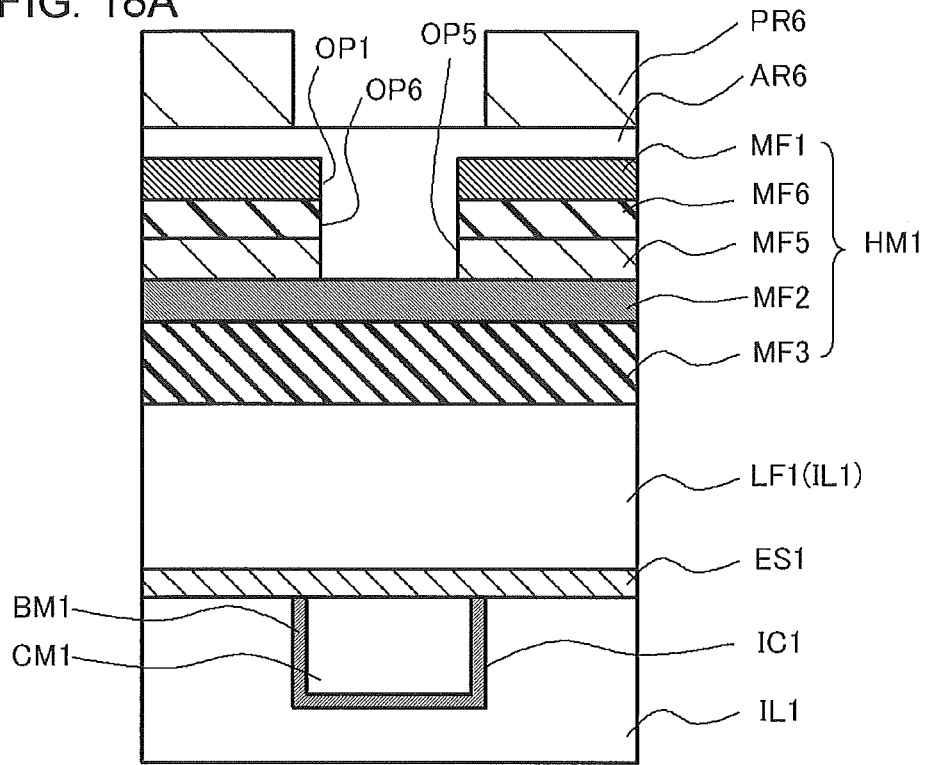
FIGS. 18A and 18B are cross-sectional views illustrating a method of manufacturing a semiconductor device according to the third embodiment.

Next, as shown in FIG. 18A, an antireflection film AR6 and a photoresist PR6 are formed in order on the hard mask film HM1 having five layers. The antireflection film AR6 is provided, for example, so as to bury the opening OP1, the opening OP5 and the opening OP6. Next, the photoresist PR6 is patterned by performing the exposure and development thereof.

Meanwhile, the width of the opening formed in the photoresist PR6 corresponding to a via pattern can be made larger than, for example, the width of the trench pattern provided in the first mask film MF1. Thereby, when the via pattern is formed, it is possible to suppress the occurrence of defective patterning due to the misalignment of the mask. In addition, in such a case, it is also possible to realize high etching selectivity between the first mask film MF1 and the second mask film MF2 in conditions of etching the second mask film MF2 as described later. That is, when the via pattern is formed, it is possible to etch only the second mask film MF2 located below the trench pattern.

Figure 18B:
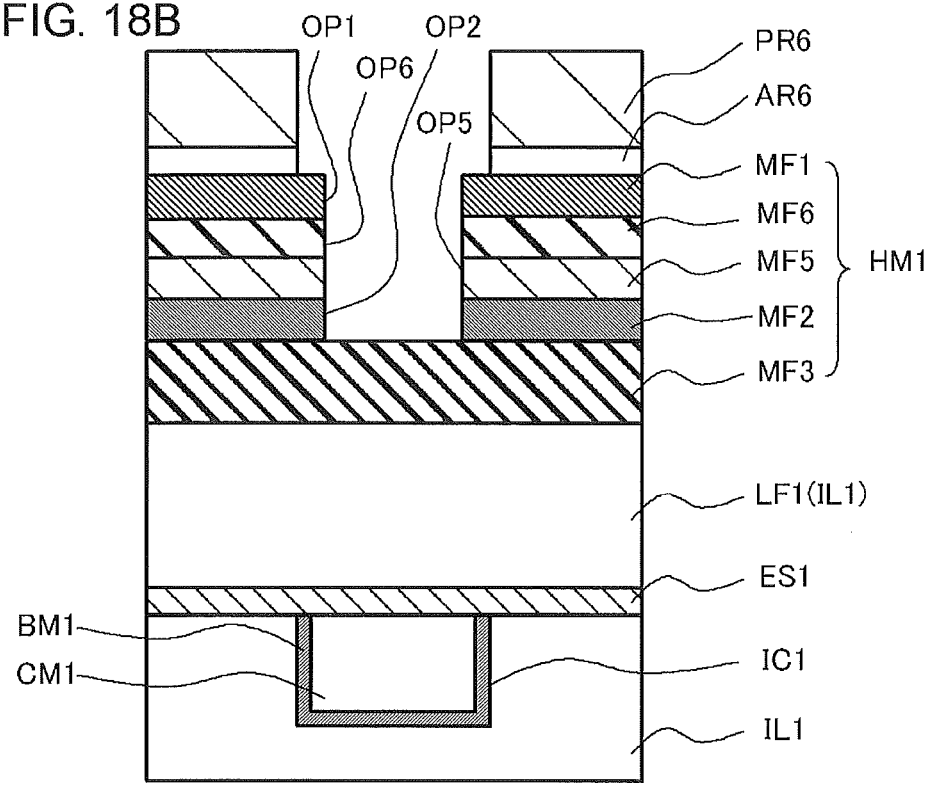

Next, as shown in FIG. 18B, the antireflection film AR6 and the second mask film MF2 are etched using the photoresist PR6 as a mask. Thereby, a via pattern constituted by the opening OP2 is formed in the second mask film MF2. The via pattern is formed, for example, so as to be located on the inside of the trench pattern formed in the first mask film MF1. The etching thereof is performed by, for example, dry etching.

Meanwhile, the first mask film MF1 is formed of an insulating material. For this reason, when the second mask film MF2 formed of a metal material is etched, it is possible to realize high etching selectivity between the first mask film MF1 and the second mask film MF2. For this reason, it is possible to suppress the removal of the first mask film MF1 at the time of forming the via pattern. Therefore, it is possible to suppress the occurrence of a problem such as the causing of defective patterning due to the deformation of the trench pattern by etching for forming the via pattern.

When the second mask film MF2 is formed of a metal material, amorphous silicon or polycrystalline silicon, the etching of the second mask film MF2 is performed using, for example, an etching gas containing chlorine.

In the present embodiment, the hard mask film HM1 formed of an insulating material and the hard mask film HM1 formed of a metal material, amorphous silicon or polycrystalline silicon are alternately laminated. For this reason, it is possible to realize sufficiently high etching selectivity between the second mask film MF2 and the third mask film MF3 located immediately below the second mask film MF2. That is, when the second mask film MF2 is etched, it is possible to suppress the etching of the third mask film MF3. For this reason, at the time of an ashing process for removing the photoresist PR6, the low dielectric constant film LF1 can be protected by the third mask film MF3.

Figure 19A:
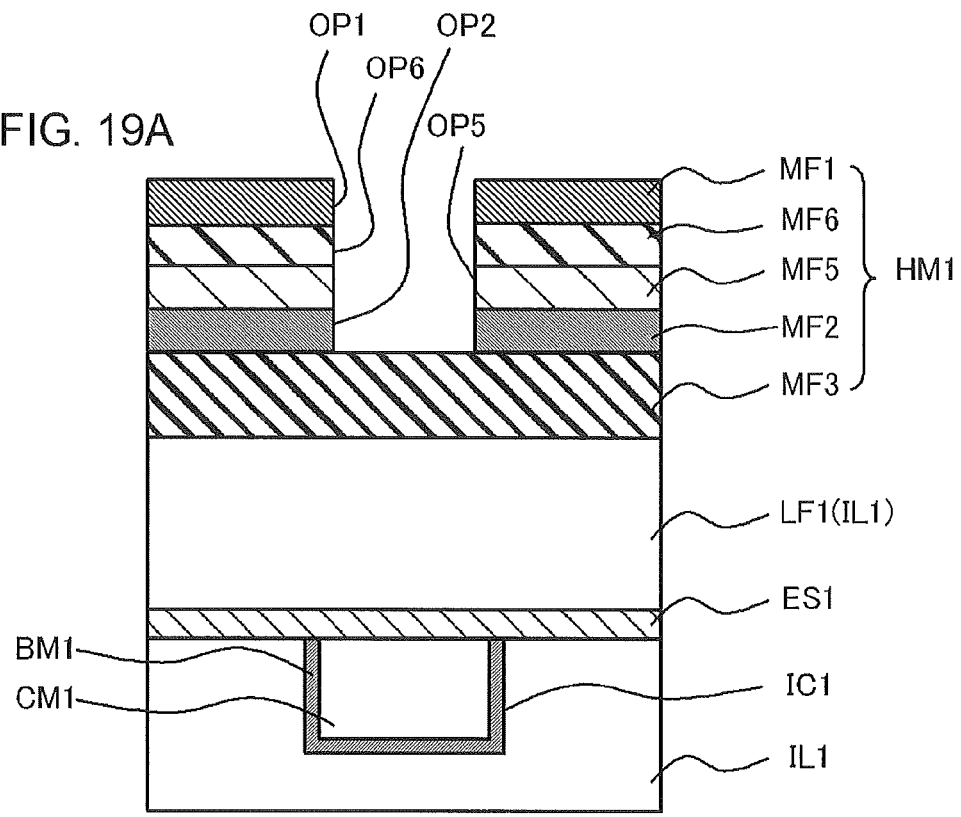
FIGS. 19A and 19B are cross-sectional views illustrating a method of manufacturing a semiconductor device according to the third embodiment.

Next, as shown in FIG. 19A, the photoresist PR6 and the antireflection film AR6 are removed. The photoresist PR6 and the antireflection film AR6 are removed by, for example, a plasma ashing process using an oxygen-containing gas.

According to the present embodiment, in the process of removing the photoresist PR6, the low dielectric constant film LF1 is covered with the third mask film MF3, and is not exposed from the via pattern constituted by the opening OP2. For this reason, it is possible to suppress the occurrence of damage in the low dielectric constant film LF1 due to the ashing process.

Figure 19B:
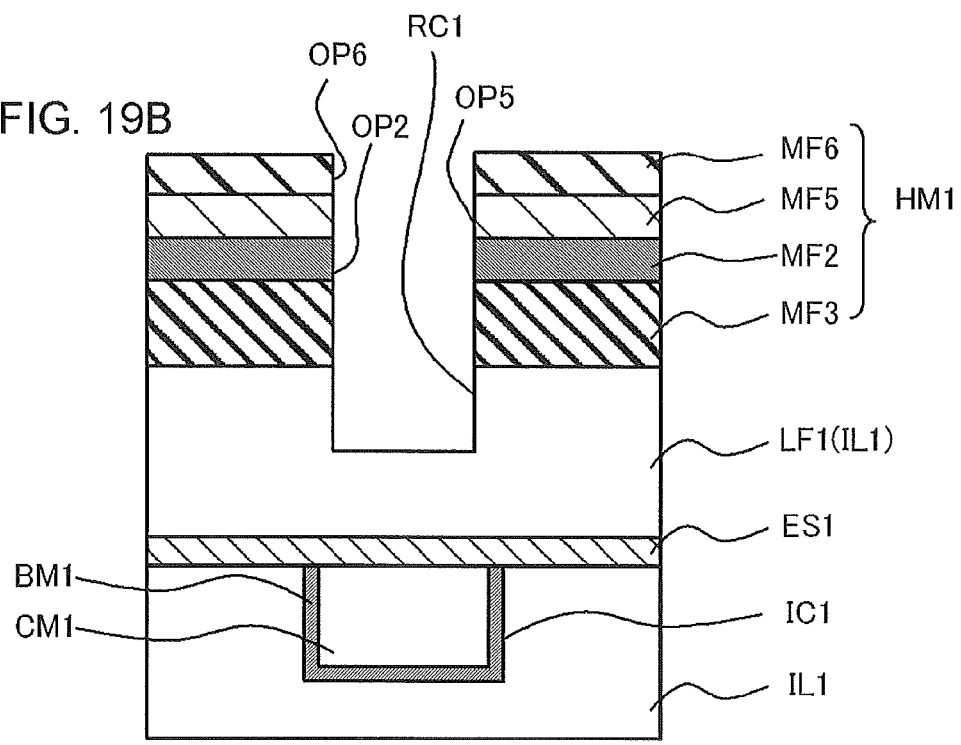

Next, as shown in FIG. 19B, the third mask film MF3 constituting the hard mask film HM1 which is located as a lowermost layer and the low dielectric constant film LF1 are etched using the sixth mask film MF6 or the second mask film MF2 (not shown in the drawing), which is protected by the photoresist PR6 in FIG. 18B and is not etched, as a mask. Thereby, the recess RC1 which passes through the third mask film MF3 and leads to the low dielectric constant film LF1 is formed. The recess RC1 is formed, for example, so as not to pass through the low dielectric constant film LF1. The etching process is performed by, for example, dry etching.

The first mask film MF1 located at an uppermost layer is removed in, for example, the process of etching the third mask film MF3 and the low dielectric constant film LF1.

Figure 20A:
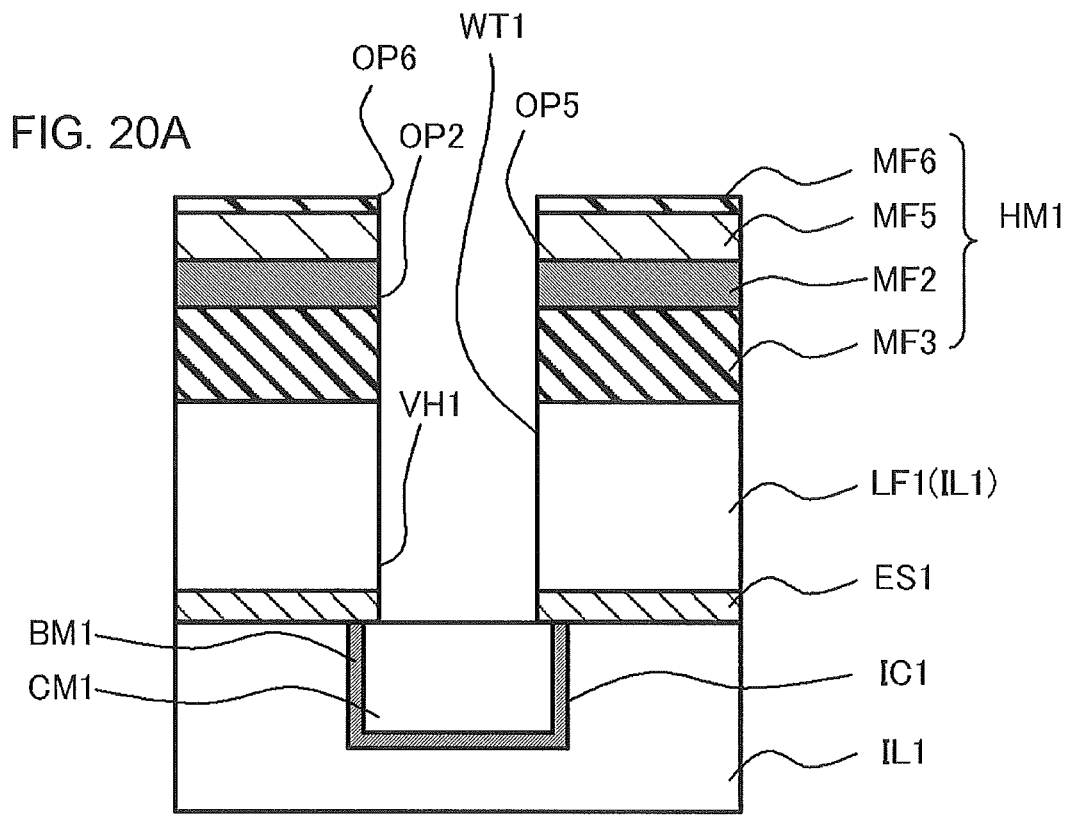
FIGS. 20A and 20B are cross-sectional views illustrating a method of manufacturing a semiconductor device according to the third embodiment.

Next, as shown in FIG. 20A, the second mask film MF2 is etched using the sixth mask film MF6 and the fifth mask film MF5 as a mask. Thereby, the trench pattern formed in the sixth mask film MF6 and the fifth mask film MF5 is transferred to the second mask film MF2. In this case, the second mask film MF2 is etched so that the opening OP2 formed in the second mask film MF2 is expanded.

Next, a portion located below the trench pattern in the third mask film MF3 is etched, and the low dielectric constant film LF1 is etched. Thereby, a via hole VH1 overlapping the recess RC1 and a trench WT1 which is located on the via hole VH1 and overlaps the trench pattern are formed in the low dielectric constant film LF1.

The process of etching the third mask film MF3 and the low dielectric constant film LF1 is performed, for example, using the sixth mask film MF6, the fifth mask film MF5 and the second mask film MF2 as a mask. For this reason, a region overlapping the trench pattern which is transferred to the sixth mask film MF6, the fifth mask film MF5 and the second mask film MF2 in the low dielectric constant film LF1 is etched. Thereby, the via hole VH1 reaching the etching stopper film ES1 is formed in a portion overlapping the recess RC1. In addition, the trench WT1 which includes the via hole VH1 on the inner side thereof when seen in a plan view and does not pass through the low dielectric constant film LF1 is formed on the via hole VH1.

Next, a portion which is located below the via hole VH1 in the etching stopper film ES1 is removed by etching. Thereby, the via hole VH1 is connected to the interconnect IC1 provided at a lower layer. This etching process is performed using, for example, a fluorocarbon-based etching gas.

Next, the conductive film CM1 is buried within the via hole VH1 and the trench WT1. The conductive film CM1 is formed on, for example, a barrier metal film BM1 that covers the inner walls of the via hole VH1 and the trench WT1. The conductive film CM1 and the barrier metal film BM1 have the same configurations as in, for example, the first embodiment.

Figure 20B:
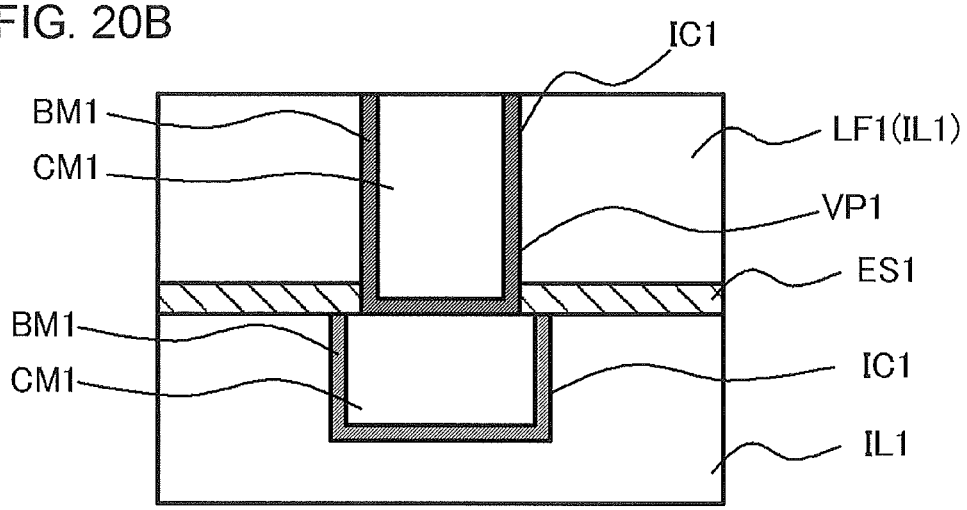

Next, a portion located outside the via hole VH1 and the trench WT1 in the barrier metal film BM1 and the conductive film CM1, and the remaining hard mask film HM1 are removed. Thereby, as shown in FIG. 20B, the via plug VP1 connected to the interconnect IC1 located on the lower layer, and the interconnect IC1 located on the via plug VP1 and connected to the via plug VP1 are formed. Meanwhile, the via plug VP1 is formed in the via hole VH1, and the interconnect IC1 is formed in the trench WT1. Here, for example, the barrier metal film BM1, the conductive film CM1, the second mask film MF2 and the third mask film MF3 are removed.

According to the present embodiment, in this manner, each interconnect layer WL1 is obtained.

In the present embodiment, it is possible to obtain the same effect as in the first embodiment.

As stated above, while the invention devised by the inventor has been described specifically based on the embodiments thereof, the present invention is not limited to the above-mentioned embodiments, but it goes without saying that various changes and modifications may be made without departing from the scope of the invention.

It is apparent that the present invention is not limited to the above embodiment, and may be modified and changed without departing from the scope and spirit of the invention.

What is claimed is:

1. A method of manufacturing a semiconductor device, comprising:
    (a) forming an interlayer insulating film over a semiconductor substrate;
    (b) forming a third hard mask film over the interlayer insulating film;
    (c) forming a second hard mask film over the third hard mask film;
    (d) forming a first hard mask film over the second hard mask film;
    (e) after the step (d), forming a first opening in the first hard mask film and a second opening in the second hard mask film by etching the first and second hard mask films, respectively;
    (f) after the step (e), etching the first hard mask film so as to expand the first opening;
    (g) after the step (f), etching the third hard mask film and a part of the interlayer insulating film in the second opening by using the second hard mask film as a mask;
    (h) after the step (g), etching the second hard mask film in the first opening in order to expand the second opening by using the first hard mask film as a mask;
    (i) after the step (h), etching the third hard mask film and the interlayer insulating film by using the first and second hard mask films as a mask, thereby a trench and a via hole are formed in the interlayer insulating film; and
    (j) embedding a conductive film in the trench and the via hole,
    wherein the interlayer insulating film has a dielectric constant less than a dielectric constant of a silicon oxide, and
    wherein each of the first, second and third hard mask films is formed of a different material from the interlayer insulating film.

2. The method of manufacturing a semiconductor device according to claim 1, wherein each of the steps (e) and (f) is performed with a resist film, and
    wherein each of the steps (g), (h) and (i) is performed without a resist film.

3. The method of manufacturing a semiconductor device according to claim 1, wherein each of the first and third hard mask films includes an insulating film, and wherein the second hard mask film includes a metal film, an amorphous silicon film or a polycrystalline silicon film.

4. The method of manufacturing a semiconductor device according to claim 3, wherein the first hard mask film is formed of SiO2, SiN, SiC or SiCN, and
    wherein the third hard mask film is formed of SiO2.

5. The method of manufacturing a semiconductor device according to claim 1, wherein each of the first and third hard mask films includes a metal film, an amorphous silicon film or a polycrystalline silicon film, and
    wherein the second hard mask film includes an insulating film.

6. The method of manufacturing a semiconductor device according to claim 5, wherein the first hard mask film is formed of W, WSi, WN or TiW.

7. The method of manufacturing a semiconductor device according to claim 1, wherein the interlayer insulating film includes Si, C and O.

* * * * *